(12) United States Patent
Nakata

(10) Patent No.: US 11,380,409 B2
(45) Date of Patent: Jul. 5, 2022

(54) DUTY ADJUSTMENT CIRCUIT, SEMICONDUCTOR STORAGE DEVICE, AND MEMORY SYSTEM

(71) Applicant: Kioxia Corporation, Tokyo (JP)

(72) Inventor: Masashi Nakata, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/184,849

(22) Filed: Feb. 25, 2021

(65) Prior Publication Data

US 2022/0068405 A1    Mar. 3, 2022

(30) Foreign Application Priority Data

Aug. 26, 2020 (JP) .............................. JP2020-142895

(51) Int. Cl.
  *G11C 16/32*  (2006.01)
  *H03K 3/017*  (2006.01)

(52) U.S. Cl.
  CPC ............. *G11C 16/32* (2013.01); *H03K 3/017* (2013.01)

(58) Field of Classification Search
  CPC .................................. G11C 16/32; H03K 3/017
  See application file for complete search history.

(56) References Cited

U.S. PATENT DOCUMENTS

| | | | | |
|---|---|---|---|---|
| 5,699,003 A | * | 12/1997 | Saeki | H03K 5/133 327/261 |
| 6,060,920 A | * | 5/2000 | Saeki | H03K 5/133 327/152 |
| 8,284,285 B2 | | 10/2012 | Takahashi | |
| 10,530,350 B2 | | 1/2020 | Hirashima et al. | |
| 2002/0036524 A1 | * | 3/2002 | Isobe | H03K 5/133 327/141 |
| 2002/0196062 A1 | * | 12/2002 | Iwashita | H03L 7/0814 327/158 |
| 2003/0052719 A1 | | 3/2003 | Na | |
| 2009/0256603 A1 | * | 10/2009 | Choi | H03L 7/0818 327/158 |
| 2020/0127653 A1 | | 4/2020 | Hirashima et al. | |
| 2020/0304116 A1 | * | 9/2020 | Muraguchi | H03K 5/05 |

FOREIGN PATENT DOCUMENTS

JP    2001-282381 A    10/2001
JP    2019-169826 A    10/2019

* cited by examiner

*Primary Examiner* — Khamdan N. Alrobaie
(74) *Attorney, Agent, or Firm* — Foley & Lardner LLP

(57) ABSTRACT

According to one embodiment, a duty adjustment circuit includes: a first delay circuit including a plurality of first delay elements connected in series, each of the first delay elements has a first delay amount; a second delay circuit having a first variable delay unit configured to set a second delay amount smaller than the first delay amount; and a third delay circuit having a second variable delay unit configured to set a third delay amount smaller than the first delay amount. An output terminal of the second delay circuit is connected to an even numbered one of the first delay elements, and an output terminal of the third delay circuit is connected to an odd numbered one of the first delay elements.

13 Claims, 25 Drawing Sheets

| DN_F | INSTRUCTION CONTENT |
|------|---------------------|
| 000  | DELAY OF MINIMUM DELAY TIME (=T0) |
| 001  | DELAY OF 1/4 UNIT TIME (=0.25 TW) |
| 010  | DELAY OF 2/4 UNIT TIME (=0.50 TW) |
| 011  | DELAY OF 3/4 UNIT TIME (=0.75 TW) |
| 100  | DELAY OF 4/4 UNIT TIME (=1.00 TW) |

FIG. 17

| DN_C | INSTRUCTION CONTENT |
|---|---|
| 000 | DELAY OF 0 UNIT TIME (=0 TW) |
| 001 | DELAY OF 1 UNIT TIME (=1 TW) |
| 010 | DELAY OF 2 UNIT TIME (=2 TW) |
| 011 | DELAY OF 3 UNIT TIME (=3 TW) |
| 100 | DELAY OF 4 UNIT TIME (=4 TW) |
| 101 | DELAY OF 5 UNIT TIME (=5 TW) |
| 110 | DELAY OF 6 UNIT TIME (=6 TW) |
| 111 | DELAY OF 7 UNIT TIME (=7 TW) |

FIG. 18

| DN_F | DN_FD (DN_C: EVEN NUMBER) | DN_FD (DN_C: ODD NUMBER) | INSTRUCTION CONTENT |
|---|---|---|---|
| 000 | 0000 | 1111 | DELAY OF 0 UNIT TIME (=0 TW) |
| 001 | 0001 | 0111 | DELAY OF 1/4 UNIT TIME (=0.25 TW) |
| 010 | 0011 | 0011 | DELAY OF 2/4 UNIT TIME (=0.50 TW) |
| 011 | 0111 | 0001 | DELAY OF 3/4 UNIT TIME (=0.75 TW) |
| 100 | 1111 | 0000 | DELAY OF 4/4 UNIT TIME (=1.00 TW) |

FIG. 19

| DN_C | DN_CD | INSTRUCTION CONTENT |
|---|---|---|
| 000 | 0000000 | DELAY OF 0 UNIT TIME (=0 Tw) |
| 001 | 0000001 | DELAY OF 1 UNIT TIME (=1 Tw) |
| 010 | 0000011 | DELAY OF 2 UNIT TIME (=2 TW) |
| 011 | 0000111 | DELAY OF 3 UNIT TIME (=3 TW) |
| 100 | 0001111 | DELAY OF 4 UNIT TIME (=4 TW) |
| 101 | 0011111 | DELAY OF 5 UNIT TIME (=5 TW) |
| 110 | 0111111 | DELAY OF 6 UNIT TIME (=6 TW) |
| 111 | 1111111 | DELAY OF 7 UNIT TIME (=7 TW) |

| DN_FD | DN_FDB | IN→FOUTB_EVN FALL DELAY TIME | IN→FOUTB_ODD FALL DELAY TIME |
|---|---|---|---|
| 0000 | 1111 | Tf | Tf+1.00Tw |
| 0001 | 1100 | Tf+0.25Tw | Tf+0.75Tw |
| 0011 | 1100 | Tf+0.50Tw | Tf+0.50Tw |
| 0111 | 1000 | Tf+0.75Tw | Tf+0.25Tw |
| 1111 | 0000 | Tf+1.00Tw | Tf |

| DN_C | CNT | INSTRUCTION CONTENT |
|---|---|---|
| 000 | 0000000 | DELAY OF 0 UNIT TIME (=0 Tw) |
| 001 | 0000001 | DELAY OF 1 UNIT TIME (=1 Tw) |
| 010 | 0000010 | DELAY OF 2 UNIT TIME (=2 Tw) |
| 011 | 0000100 | DELAY OF 3 UNIT TIME (=3 Tw) |
| 100 | 0001000 | DELAY OF 4 UNIT TIME (=4 Tw) |
| 101 | 0010000 | DELAY OF 5 UNIT TIME (=5 Tw) |
| 110 | 0100000 | DELAY OF 6 UNIT TIME (=6 Tw) |
| 111 | 1000000 | DELAY OF 7 UNIT TIME (=7 Tw) |

DUTY ADJUSTMENT CIRCUIT, SEMICONDUCTOR STORAGE DEVICE, AND MEMORY SYSTEM

CROSS-REFERENCE TO RELATED APPLICATION(S)

This application is based upon and claims the benefit of priority from Japanese Patent Application No. 2020-142895, filed on Aug. 26, 2020, the entire contents of which are incorporated herein by reference.

FIELD

Embodiments described herein relate generally to a duty adjustment circuit, a semiconductor storage device, and a memory system.

BACKGROUND

A duty adjustment circuit capable of adjusting the duty cycle of a clock, and a semiconductor storage device and a memory system provided with the duty adjustment circuit are known.

DESCRIPTION OF THE DRAWINGS

FIG. 17 illustrates an example of the value of a code signal DN_C.
FIG. 18 illustrates an example of the value of a code signal DN_FD.
FIG. 19 illustrates an example of the value of a code signal DN_CD.

DETAILED DESCRIPTION

Embodiments provide a duty adjustment circuit, a semiconductor storage device, and a memory system capable of improving the reliability of an operation.

In general, according to one embodiment, the duty adjustment circuit includes: a first delay circuit including a plurality of first delay elements connected in series, each of the first delay elements has a first delay amount; a second delay circuit having a first variable delay unit configured to set a second delay amount smaller than the first delay amount; and a third delay circuit having a second variable delay unit configured to set a third delay amount smaller than the first delay amount. An output terminal of the second delay circuit is connected to an even numbered one of the first delay elements, and an output terminal of the third delay circuit is connected to an odd numbered one of the first delay elements.

Hereinafter, embodiments will be described with reference to the accompanying drawings.

(1. Configuration)
(1-1. Configuration of Memory System)

Figure 1:
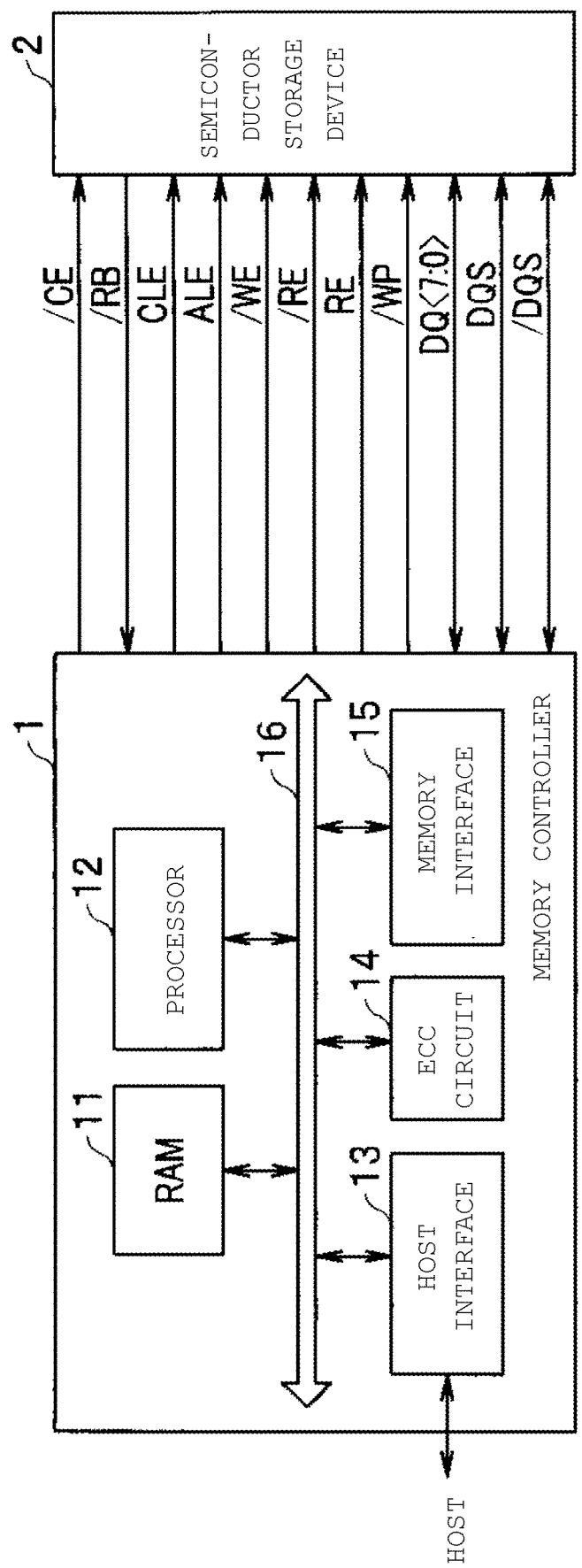
FIG. 1 is a block diagram illustrating a configuration example of a memory system according to an embodiment of the present disclosure.

FIG. 1 is a block diagram illustrating a configuration example of a semiconductor device according to the present embodiment. The memory system of the present embodiment includes a memory controller 1 and a semiconductor storage device 2. The memory system may be connected to a host. The host is, for example, an electronic device such as a personal computer or a mobile terminal.

The semiconductor storage device 2 includes a memory that stores data in a non-volatile manner (hereinafter, referred to as a non-volatile memory). The non-volatile memory is, for example, a NAND memory (NAND flash memory) that has a memory cell capable of storing 3 bits per memory cell, that is, a NAND memory of 3 bits/cell (TLC:

Triple Level Cell). The non-volatile memory 2 may be a 1-bit/cell, 2-bits/cell, or 4-bits/cell NAND memory.

The memory controller 1 controls the writing of data to the semiconductor storage device 2 in response to a write request from the host. Further, the memory controller 1 controls the reading of data from the semiconductor storage device 2 in response to a read request from the host. Each of a chip enable signal /CE, a ready busy signal /RB, a command latch enable signal CLE, an address latch enable signal ALE, a write enable signal /WE, read enable signals RE and /RE, a write protect signal /WP, a data signal DQ <7:0>, and data strobe signals DQS and /DQS is transmitted and received between the memory controller 1 and the semiconductor storage device 2. In the present specification, the symbol "/" before the name of a signal indicates an inversion logic of the signal whose name is not accompanied by the symbol "/."

For example, the semiconductor storage device 2 and the memory controller 1 are each formed as a semiconductor chip (hereinafter, also simply referred to as a "chip").

The chip enable signal/CE is a signal that enables the semiconductor storage device 2. The ready busy signal/RB is a signal indicating whether the semiconductor storage device 2 is in a ready state (a state of accepting an external command) or a busy state (a state of not accepting an external command). The command latch enable signal CLE is a signal indicating that the signal DQ <7:0> is a command. The address latch enable signal ALE is a signal indicating that the signal DQ <7:0> is an address. The write enable signal /WE is a signal that introduces the received signal into the semiconductor storage device 2, and is asserted by the memory controller 1 each time a command, an address, and data are received. The semiconductor storage device 2 is instructed to introduce the signal DQ <7:0> while the write enable signal /WE is at the "L (low)" level.

The read enable signals RE and /RE are signals for the memory controller 1 to read data from the semiconductor storage device 2. For example, such signals are used to control the operation timing of the semiconductor storage device 2 when outputting the signal DQ <7:0>. The write protect signal /WP is a signal that instructs the semiconductor storage device 2 to prohibit data writing and erasing. The signal DQ <7:0> is data transmitted and received between the semiconductor storage device 2 and the memory controller 1, and includes a command, an address, and data. The data strobe signals DQS and /DQS are signals that control the input/output timing of the signal DQ <7:0>.

The memory controller 1 includes a random access memory (RAM) 11, a processor 12, a host interface circuit 13, an error check and correct (ECC) circuit 14, and a memory interface 15. The RAM 11, the processor 12, the host interface circuit 13, the ECC circuit 14, and the memory interface 15 are connected to each other via an internal bus 16.

The host interface circuit 13 outputs a request received from the host and user data (write data) to the internal bus 16. Further, the host interface circuit 13 transmits the user data read from the semiconductor storage device 2 and the response from the processor 12 to the host.

The memory interface 15 controls a process of writing user data to the semiconductor storage device 2 or a process of reading the user data from the semiconductor storage device 2 based on the instruction of the processor 12.

The processor 12 comprehensively controls the memory controller 1. The processor 12 is, for example, a central processing unit (CPU) or a micro processing unit (MPU). When receiving a request from the host via the host interface circuit 13, the processor 12 instructs the memory interface 15 to write the user data and the parity to the semiconductor storage device according to the request. Further, the processor 12 instructs the memory interface 15 to read the user data and the parity from the semiconductor storage device 2 in response to the request from the host.

The processor 12 determines a storage area (memory area) on the semiconductor storage device 2 for the user data stored in the RAM 11. The user data is stored in the RAM 11 via the internal bus 16. The processor 12 determines the memory area for the page-based data (page data), which is the writing unit. In the present specification, user data stored on one page of the semiconductor storage device 2 is defined as unit data. The unit data is generally encoded by the ECC circuit 14 and stored in the semiconductor storage device 2 as a code word. In the present embodiment, coding is not essential. The memory controller 1 may be stored in the unit data and the semiconductor storage device 2 without being encoded, but FIG. 1 illustrates a configuration in which an encoding is performed as a configuration example. When the memory controller 1 does not perform an encoding, the page data matches the unit data. Further, a single code word may be generated based on a piece of unit data, or a single code word may be generated based on the divided data in which the unit data is divided. Further, a single code word may be generated by using plural pieces of unit data.

The processor 12 determines the memory area of the semiconductor storage device 2 to be written for each unit data. A physical address is assigned to the memory area of the semiconductor storage device 2. The processor 12 manages the memory area to which the unit data is written by using the physical address. The processor 12 specifies the determined memory area (physical address) and instructs the memory interface 15 to write the user data to the semiconductor storage device 2. The processor 12 manages a correspondence between the logical address of the user data (logical address managed by the host) and the physical address. When receiving a read request including a logical address from the host, the processor 12 specifies the physical address corresponding to the logical address, designates the physical address, and instructs the memory interface 15 to read the user data.

The ECC circuit 14 encodes the user data stored in the RAM 11 to generate a code word. Further, the ECC circuit 14 decodes the code word read from the semiconductor storage device 2.

The RAM 11 temporarily stores the user data received from the host until the user data is stored in the semiconductor storage device 2, or temporarily stores the data read from the semiconductor storage device 2 until the data is transmitted to the host. The RAM 11 may be, for example, a general-purpose memory such as a static random access memory (SRAM) or a dynamic random access memory (DRAM).

Although FIG. 1 illustrates a configuration example in which the memory controller 1 includes an ECC circuit 14 and a memory interface 15, the ECC circuit 14 may be built in the memory interface 15. Further, the ECC circuit 14 may be built in the semiconductor storage device 2.

When a write request is received from the host, the semiconductor device operates as follows. The processor 12 temporarily stores the data to be written in the RAM 11. The processor 12 reads the data stored in the RAM 11 and inputs the read data into the ECC circuit 14. The ECC circuit 14 encodes the input data and inputs the code word into the memory interface 15. The memory interface 15 writes the input code word in the semiconductor storage device 2.

When a read request from the host is received, the semiconductor device operates as follows. The memory interface 15 inputs the code word read from the semiconductor storage device 2 into the ECC circuit 14. The ECC circuit 14 decodes the input code word and stores the decoded data in the RAM 11. The processor 12 transmits the data stored in the RAM 11 to the host via the host interface circuit 13.

(1-2. Configuration of Semiconductor Storage Device)

Figure 2:
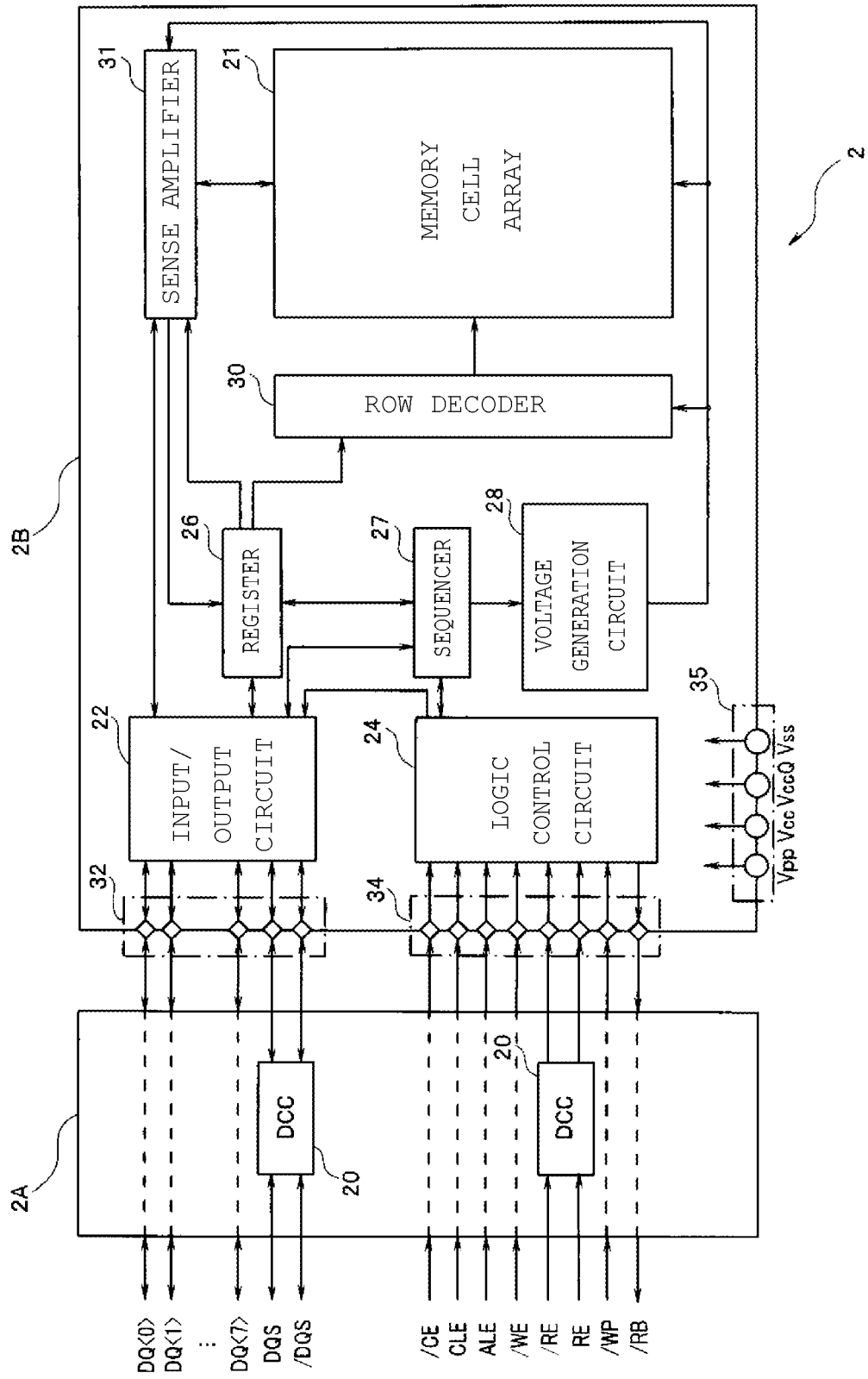
FIG. 2 is a block diagram illustrating a configuration example of a semiconductor storage device of the present embodiment.

FIG. 2 is a block diagram illustrating a configuration example of a semiconductor storage device of the present embodiment. The semiconductor storage device 2 of the present embodiment includes an interface chip 2A and a non-volatile memory 2B.

The interface chip 2A has a function of interfacing each signal of a chip enable signal /CE, a ready busy signal /RB, a command latch enable signal CLE, an address latch enable signal ALE, a write enable signal /WE, read enable signals RE and /RE, a write protection signal /WP, a data signal DQ <7:0>, and data strobe signals DQS and /DQS between the memory controller 1 and the non-volatile memory 2B. The interface chip 2A transfers, for example, a command CMD and an address ADD in the signal DQ <7:0> to the non-volatile memory 2B together with the data strobe signals DQS and /DQS. Further, for example, along with the data strobe signals DQS and /DQS, the write data and the read data in the signal DQ <7:0> are transmitted and received to and from the non-volatile memory 2B.

Further, the interface chip 2A has a frequency boost function for improving the I/O speed of the non-volatile memory 2B. For example, the interface chip 2A has a function of transferring a signal input from the memory controller 1 to the non-volatile memory 2B by a double data rate (DDR) method. When such a high-speed transfer method is used, it is necessary to adjust the duty cycle of the signal instructing the timing of transmitting and receiving the signal DQ <7:0> between the memory controller 1 and the non-volatile memory 2B (specifically, the read enable signals RE and /RE and the data strobe signals DQS and /DQS) with high accuracy. The interface chip 2A includes a duty cycle direction (DCC) circuit 20 for adjusting the duty cycles of the read enable signals RE and /RE and the data strobe signals DQS and /DQS.

More specifically, the interface chip 2A includes a DCC circuit 20a that adjusts the duty cycles of the read enable signals RE and /RE, which are output from the memory controller 1 and input into the non-volatile memory 2B, and a DCC circuit 20b that adjusts the duty cycles of the data strobe signals DQS and /DQS, which are output from the memory controller 1 and input into the non-volatile memory 2. The DCC circuit 20b may also adjust the duty cycles of the data strobe signals DQS and /DQS which are output from the non-volatile memory 2 and input into the memory controller 1. The specific configuration of the DCC circuit 20 will be described in detail later.

The non-volatile memory 2B includes a memory cell array 21, an input/output circuit 22, a logic control circuit 24, a register 26, a sequencer 27, a voltage generation circuit 28, a row decoder 30, a sense amplifier unit 31, an input/output pad group 32, a logic control pad group 34, and a power input terminal group 35.

The memory cell array 21 includes a plurality of non-volatile memory cell transistors (not illustrated) associated with word lines and bit lines.

The input/output circuit 22 transmits and receives the signal DQ <7:0> and the data strobe signals DQS and /DQS to and from the memory controller 1 via the interface chip 2A. The input/output circuit 22 transfers the command and address in the signal DQ <7:0> to the register 26. Further, the input/output circuit 22 transmits and receives write data and read data to and from the sense amplifier unit 31.

The logic control circuit 24 receives a chip enable signal /CE, a command latch enable signal CLE, an address latch enable signal ALE, a write enable signal /WE, read enable signals RE and /RE, and a write protect signal /WP from the memory controller 1 via the interface chip 2A. Further, the logic control circuit 24 transfers the ready busy signal /RB to the memory controller 1 via the interface chip 2A, and notifies the state of the non-volatile memory 2B to the outside.

The voltage generation circuit 28 generates a voltage necessary for operations such as writing, reading, and erasing data based on an instruction from the sequencer 27.

The row decoder 30 receives the block address and the row address in the address from the register 26, selects the corresponding block based on the block address, and selects the corresponding word line based on the row address.

When reading data, the sense amplifier unit 31 senses the read data read from the memory cell transistor into the bit line, and transfers the sensed read data to the input/output circuit 22. When writing data, the sense amplifier unit 31 transfers the write data written via the bit line to the memory cell transistor. The sense amplifier unit 31 includes a plurality of sense amplifiers SA.

In order to transmit and receive each signal including data to and from the interface chip 2A, the input/output pad group 32 includes a plurality of terminals corresponding to the signal DQ <7:0> and the data strobe signals DQS and /DQS.

In order to transmit and receive each signal including data to and from the interface chip 2A, the logic control pad group 34 includes a plurality of terminals (pads) corresponding to the chip enable signal /CE, the command latch enable signal CLE, the address latch enable signal ALE, the write enable signal /WE, the read enable signals RE and /RE, and the write protect signal /WP.

The power input terminal group 35 includes a plurality of terminals that inputs power supply voltages Vcc, VccQ, and Vpp and a ground voltage Vss in order to supply various operating power supplies to the non-volatile memory 2B from the outside. The power supply voltage Vcc is a circuit power supply voltage which is generally given from the outside as an operating power supply, and for example, a voltage of about 3.3 V is input. For the power supply voltage VccQ, for example, a voltage of 1.2 V is input. The power supply voltage VccQ is used as a power supply for driving an input/output system that transmits and receives signals between the memory controller 1 and the non-volatile memory 2B.

The power supply voltage Vpp is a power supply voltage higher than the power supply voltage Vcc, and for example, a voltage of 12 V may be input. For example, when the non-volatile memory 2B is used in an environment where a high voltage may not be supplied, the power supply voltage Vpp may not be supplied with a voltage. Even when the power supply voltage Vpp is not supplied, the non-volatile memory 2B may execute various operations as long as the power supply voltage Vcc is supplied. That is, the power supply voltage Vcc is a power supply that is supplied to the non-volatile memory 2B as standard, and the power supply voltage Vpp is a power supply that is additionally and freely supplied according to, for example, the usage environment.

When reading data, the sense unit 24 detects the data read from the NAND memory cell array 23. Further, when writing data, the sense unit 24 temporarily stores the write data input from the memory controller 1 via the interface chip 2, and transfers the write data to the NAND memory cell array 23.

(1-3. Configuration of DCC Circuit)

Figure 3:
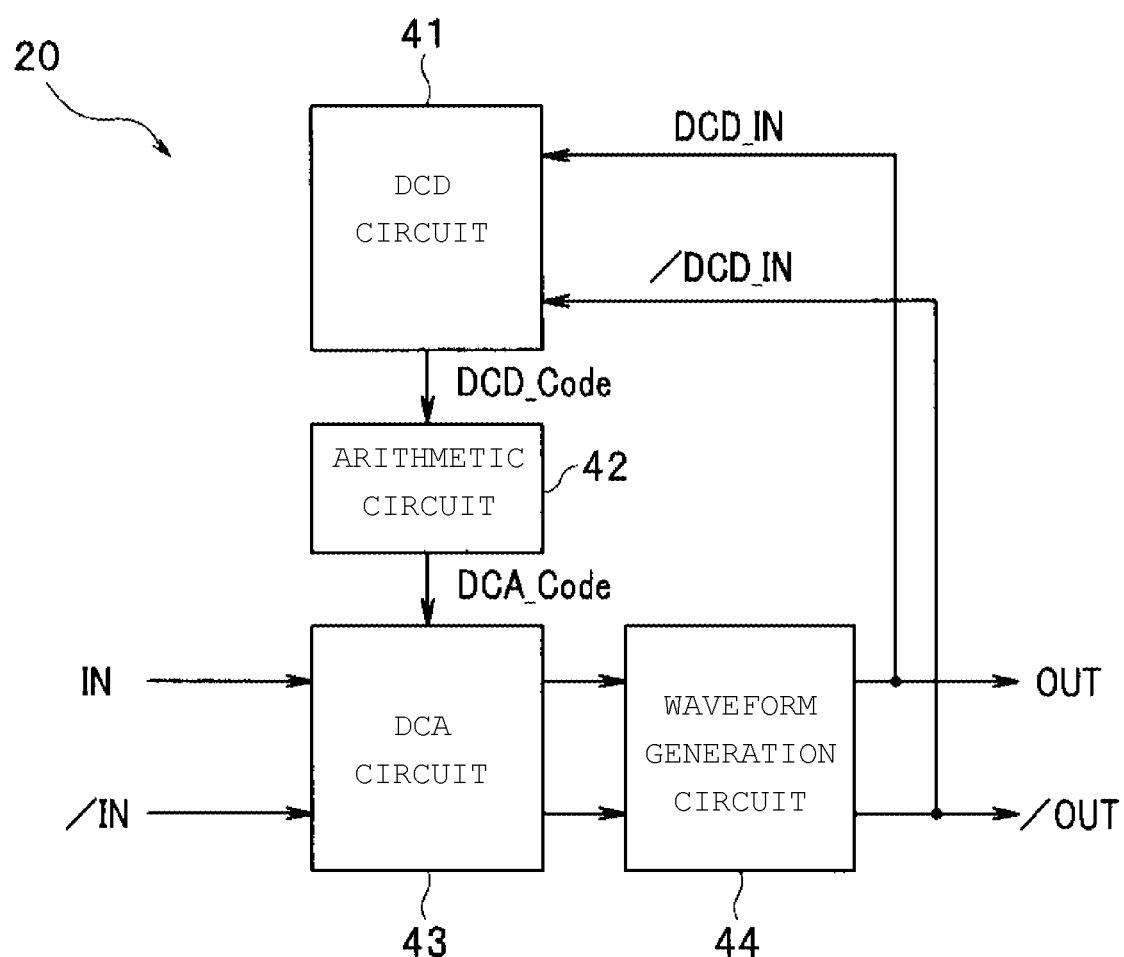
FIG. 3 is a block diagram illustrating a configuration example of a DCC circuit.

FIG. 3 is a block diagram illustrating a configuration example of a DCC circuit. The DCC circuit 20 of the embodiment includes a duty cycle detector (DCD) circuit 41, an arithmetic circuit 42, a duty cycle adjustor (DCA) circuit 43, and a waveform generation circuit 44.

The DCD circuit 41 is a circuit that observes the duty error of the clock signal to be duty-corrected and converts the duty error into the number of stages of a delay element. The DCD circuit 41 detects (measures) the pulse width of an input clock DCD_IN (the period at a high level) and the pulse width of the input clock /DCD_IN to output a signal DCD_CODE indicating the pulse width of the input clock DCD_IN and the pulse width of the input clock /DCD_IN. The signal DCD_CODE includes a plurality of bits (e.g., 32 bits).

The arithmetic circuit 42 is a circuit that calculates a delay setting value of a clock signal to be duty-corrected based on an output signal from the DCD circuit 41. The arithmetic circuit 42 receives the signal DCD_CODE output from the DCD circuit 41, and compares the pulse width of the input clock DCD_IN with the pulse width of the input clock /DCD_IN. Then, a signal DCA_CODE is generated based on the comparison result.

The DCA circuit 43 generates a delay clock CDLY_T of the input clock IN to be duty-corrected and a delay clock CDLY_B of the rise of the input clock /IN based on the signal DCA_CODE.

The waveform generation circuit 44 receives delay clocks CDLY_T and CDLY_B output from the DCA circuit 43, and generates output clocks OUT and /OUT. That is, the output clocks OUT and /OUT are output signals after adjusting the duty cycles of the input clocks IN and /IN. The output clocks OUT and /OUT generated by the waveform generation circuit 44 are output from the DCC circuit 20 and input into the DCD circuit 41.

(1-3-1. Configuration of DCD Circuit)

Figure 4:
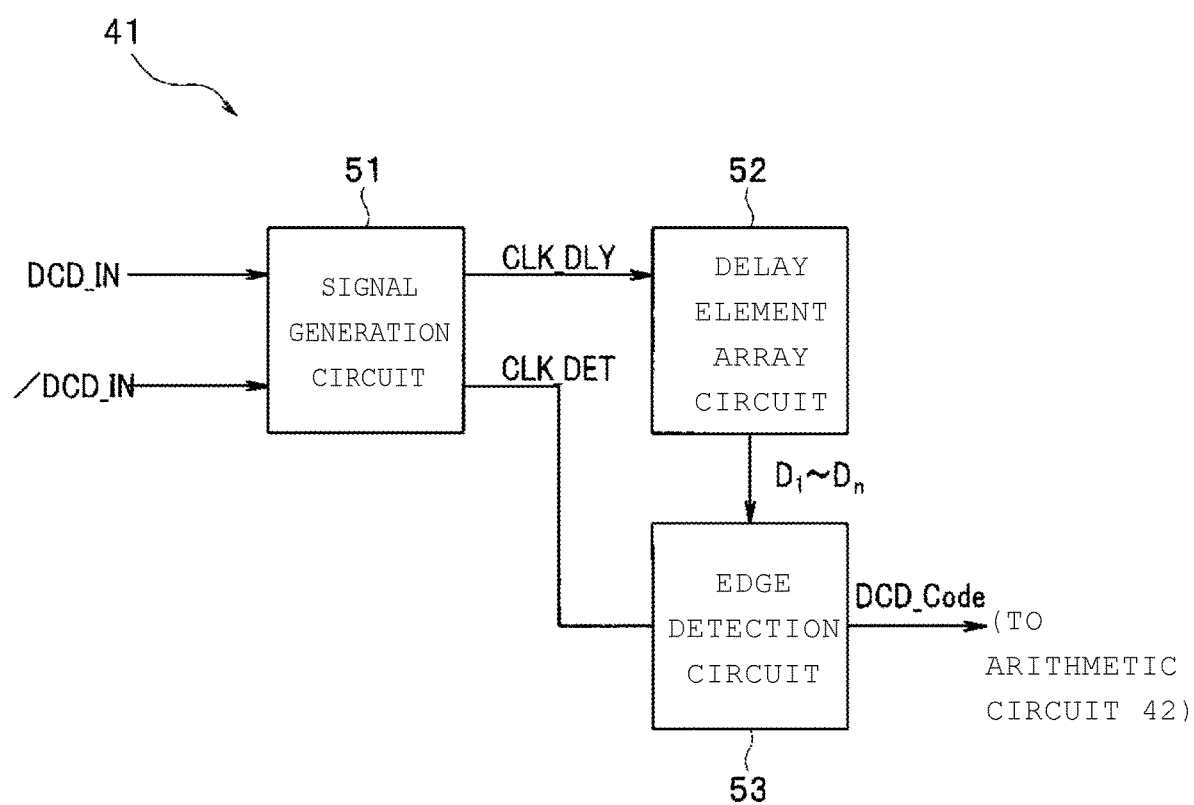
FIG. 4 is a block diagram illustrating a configuration example of a DCD circuit.

FIG. 4 is a block diagram illustrating a configuration example of a DCD circuit. The DCC circuit 41 of the embodiment includes a signal generation circuit 51, a delay element array circuit 52, and an edge detection circuit 53.

The input clocks DCD_IN and /DCD_IN are input into the signal generation circuit 51. The signal generation circuit 51 generates a signal CLK_DLY and a signal CLK_DET from the input clocks DCD_IN and /DCD_IN.

The high-level period of the signal CLK_DLY and the high-level period of the signal CLK_DET are set to the same length as one cycle of the input clock DCD_IN (i.e., the same length as one cycle of the input clock /DCD_IN).

The rise of the even-numbered cycle of the signal CLK_DLY is set at the same timing as the rise of the input clock DCD_IN. Further, the rise of the odd-numbered cycle of the signal CLK_DLY is set at the same timing as the rise of the input clock /DCD_IN.

The rise of the even-numbered cycle of the signal CLK_DET is set at the same timing as the fall of the input clock DCD_IN. Further, the rise of the odd-numbered cycle of the signal CLK_DET is set at the same timing as the fall of the input clock /DCD_IN.

That is, the period from the rise of the even-numbered cycle of the signal CLK_DLY to the rise of the signal CLK_DET has the same length as the high-level period of the input clock DCD_IN. Also, the signal CLK_DLY and the signal CLK_DET are generated so that the period from the rise of the odd-numbered cycle of the signal CLK_DLY to the rise of the signal CLK_DET has the same length as the high-level period of the input clock /DCD_IN. Therefore, by continuously measuring the period from the rise of the input clock DCD_IN to the rise of the input clock DCD_IN, it is possible to alternately observe the high-level period of the input clock DCD_IN and the high-level period of the input clock /DCD_IN.

In addition, in the signal CLK_DLY and the signal CLK_DET, the period from the rise of the nth cycle to the rise of the n+1st cycle is assumed to be a sufficient period from the measurement of the high-level period of the input clock DCD_IN or /DCD_IN to the generation of the signal DCD_CODE.

The delay element array circuit 52 uses the signal CLK_DLY input from the signal generation circuit 51 to generate signals Dn (D1 to Dn) of n (n is a natural number of 2 or more) bits. A set of signals Dn indicates a high-level period of one cycle having the signal CLK_DLY.

Figure 5:
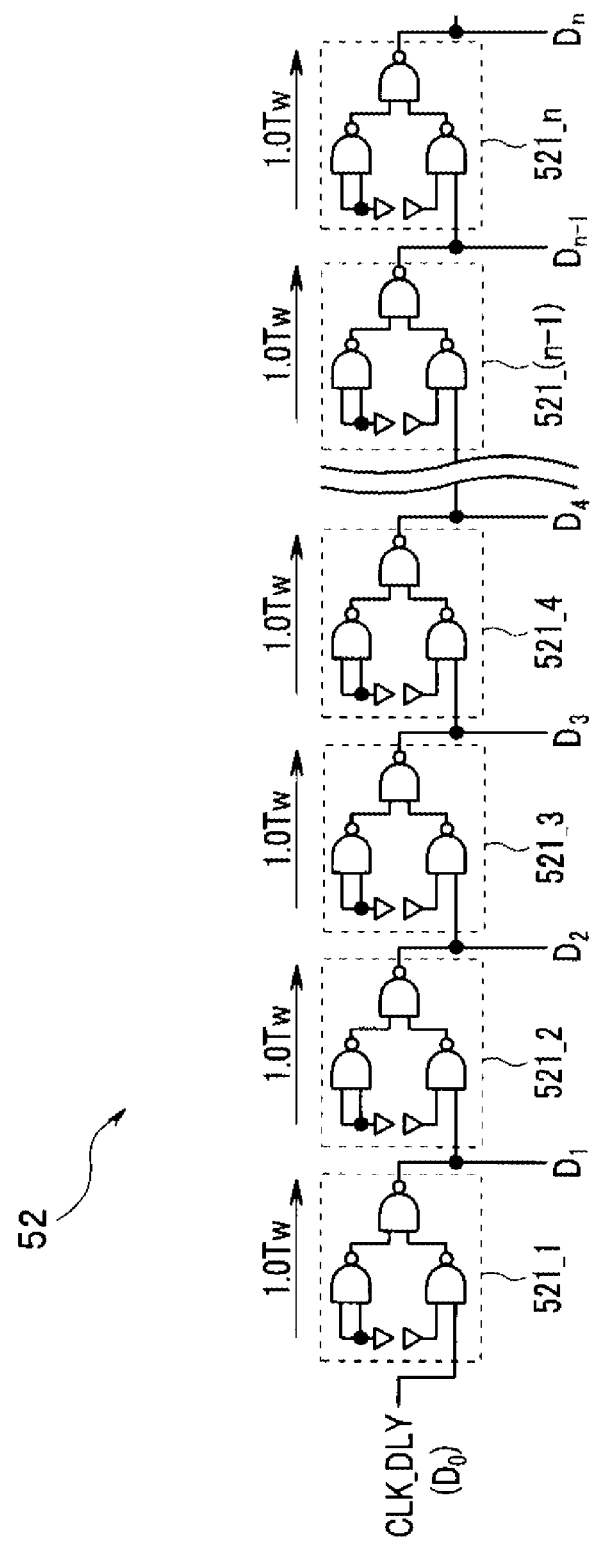
FIG. 5 is a circuit diagram illustrating an example of a delay element array circuit.

FIG. 5 is a circuit diagram illustrating an example of a delay element array circuit. The delay element array circuit 52 includes n delay elements 521_1 to 521_n. In each case where α (α is a natural number of 1 or more and n or less) is 1 or more and n or less, the delay element 521_α receives a signal D(α−1) and outputs a signal Dα. A signal D0 is assumed to be equal to the signal CLK_DLY. Hereinafter, the notation including the symbol "α" is assumed to collectively indicate all cases in which α is 1 or more and n or less. That is, the notation including the symbol "α" is assumed to collectively indicates the case where α is 1, the case where α is 2, . . . , and the case where α is n. The signal Dα is a signal in which the signal D(α−1) is delayed by a certain time. The delay element 521_α receives the signal CLK_DLY, stores the logic level of the signal Dα when the signal CLK_DLY shifts to the high level, and continues to output the signal Dα having the same logic level as the logic level of the stored signal Dα.

A delay amount of each of the delay elements 521_1 to 521_n may vary due to unintended variations in the performance of the delay elements 521_1 to 521_n, but is intended to be time Tw. In the following description, it is assumed that the delay amounts of the delay elements 521_1 to 521_n are equal to time Tw. The delay element 521_α includes, for example, three NAND gates. The first NAND gate receives the signal D(α−1) at one input. Also, the first NAND gate is grounded at the other input, that is, connected to a node having a ground potential Vss. The second NAND gate is grounded at the two inputs, that is, connected to a node having a ground potential Vss. The third NAND gate receives the output of the first NAND gate and the output of the second NAND gate, and outputs the signal Dα. The delay element 521_α causes a delay equal to time Tw.

Figure 6:
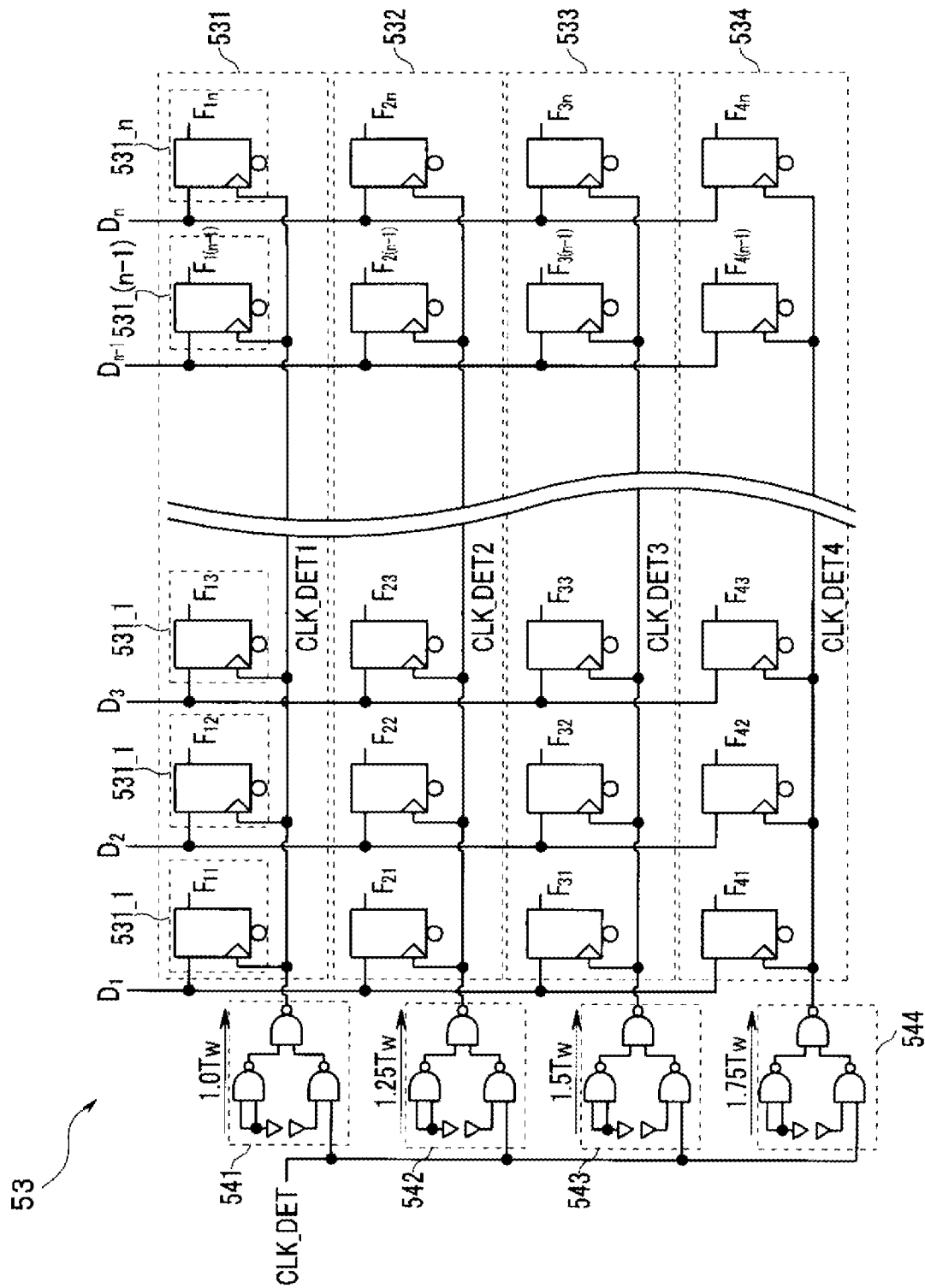
FIG. 6 is a circuit diagram illustrating an example of an edge detection circuit.

The edge detection circuit 53 receives the signals D1 to Dn output from the delay element array circuit 52 and the signal CLK_DET output from the signal generation circuit 51 to output the signal DCD_CODE. FIG. 6 is a circuit diagram illustrating an example of an edge detection circuit. The edge detection circuit 53 includes m (m is a natural number of 2 or more) delay lines 53*m*. Each delay line 53β (β is a natural number of 1 or more and m or less) includes n D-type flip-flops (hereinafter, simply referred to as a flip-flop) 53β_1 to 53β_n. Hereinafter, the notation including the symbol "β" is assumed to collectively indicate all cases in which β is 1 or more and m or less. That is, the notation including the symbol "β" is assumed to collectively indicate the case where β is 1, the case where β is 2, . . . , the case where β is m. The edge detection circuit 53 also includes m delay elements 54β. The delay amount of each delay element 54β is set to be time {1.0+(m−1)/m}×Tw.

Each delay element 54β receives the signal CLK_DET output from the signal generation circuit 51, delays the time by a set time, and outputs the signal to the delay line 53β. The delay element 54β includes, for example, three NAND gates. The first NAND gate receives the signal CLK_DET at one input. Also, the first NAND gate is grounded at the other input, that is, connected to a node having a ground potential Vss. The second NAND gate is grounded at the two inputs, that is, connected to a node having a ground potential Vss. The third NAND gate receives the output of the first NAND gate and the output of the second NAND gate, and outputs a signal CLK_DETm. The delay element 54β causes a delay equal to time {1.0+(m−1)/m}×Tw.

FIG. 6 illustrates an edge detection circuit 53 when m=4, as an example. The delay amount of the delay element 541 is time {1.0+(1−1)/4}Tw=1.0 Tw. The delay element 541 receives the signal CLK_DET, delays the time by 1.0 Tw, and outputs a signal CLK_DET1. The delay amount of the delay element 542 is time {1.0+(2−1)/4}Tw=1.25 Tw. The delay element 542 receives the signal CLK_DET, delays the time by 1.25 Tw, and outputs a signal CLK_DET2. The delay amount of the delay element 543 is time {1.0+(3−1)/4}Tw=1.5 Tw. The delay element 543 receives the signal CLK_DET, delays the time by 1.5 Tw, and outputs a signal CLK_DET3. The delay amount of the delay element 544 is time {1.0+(4−1)/4}Tw=1.75 Tw. The delay element 544 receives the signal CLK_DET, delays the time by 1.75 Tw, and outputs a signal CLK_DET4.

The flip-flop 53β_α of the delay line 53β receives the signal Dα output from the delay element 521_α of the delay element array circuit 52 at the data input, receives a signal CLK_DETβ at the clock input, and outputs a signal Fβα. For example, the flip-flop 531_1 of the delay line 531 receives the signal D1 at the data input, receives the signal CLK_DET1 at the clock input, and outputs a signal F11. The flip-flop 534_n of the delay line 534 receives the signal Dn at the data input, receives the signal CLK_DET4 at the clock input, and outputs a signal F4n. That is, the edge detection circuit 53 generates an m×n-bit signal Fmn and outputs the signal as a signal DCD_CODE.

(1-3-2. Configuration of Arithmetic Circuit)

The arithmetic circuit 42 is a circuit that calculates a delay setting value of a clock signal to be duty-corrected based on an output signal from the DCD circuit 41. The arithmetic circuit 42 receives the signal DCD_CODE output from the DCD circuit 41, and compares the pulse width of the input clock DCD_IN (high-level period) with the pulse width of the input clock /DCD_IN (high-level period). Then, a signal DCA_CODE is generated based on the comparison result. The code signal DCA_CODE includes code signals DN_F and DN_C for correcting the rising timing of the input clock IN, and code signals UP_F and UP_C for correcting the rising timing of the input clock /IN. In the code signal DCA_CODE, for example, an m-bit code signal DN_F, an n-bit code signal DN_C, an m-bit code signal UP_F, and an n-bit code signal UP_C are output in this order. The generation of the signal DCA_CODE in the arithmetic circuit 42 will be described in detail later.

(1-3-3. Configuration of DCA Circuit)

Figure 7:
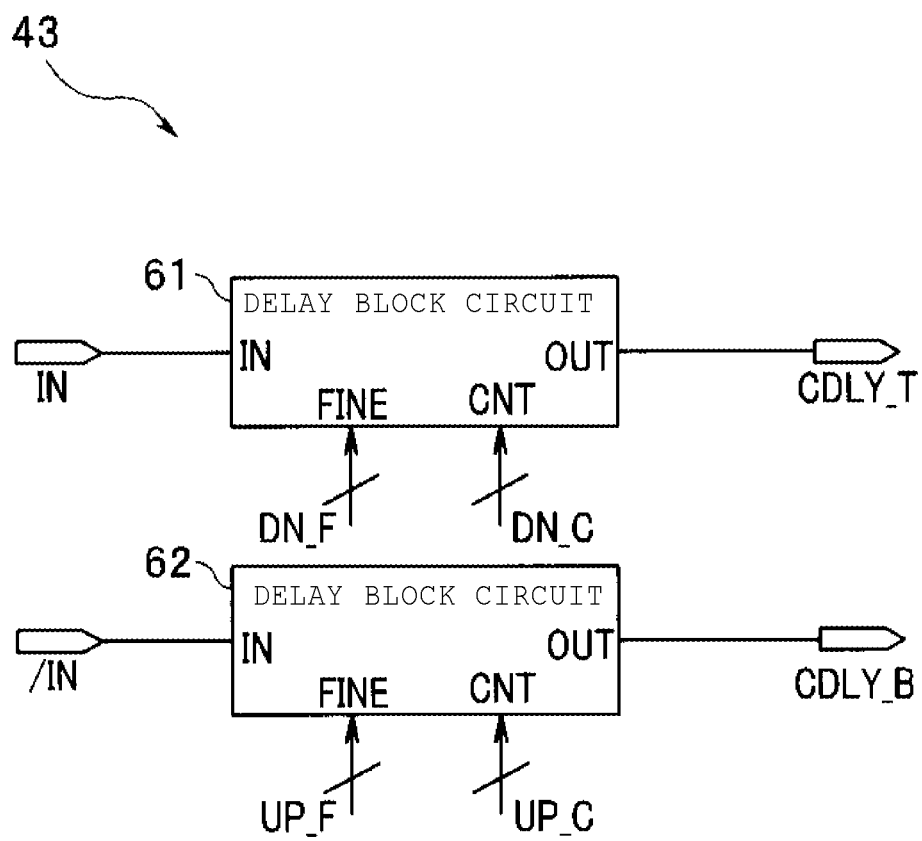
FIG. 7 is a block diagram illustrating a configuration example of a DCA circuit.

FIG. 7 is a block diagram illustrating a configuration example of a DCA circuit. The DCA circuit 43 of the embodiment includes two delay block circuits 61 and 62. The delay block circuit 61 is a delay circuit that corrects the rising timing of the input clock IN. The delay block circuit 61 receives the input clock IN and the code signals DN_F and DN_C constituting the signal DCA_CODE, and generates the delay clock CDLY_T. The delay block circuit 62 is a delay circuit that corrects the rising timing of the input clock /IN. The delay block circuit 62 receives the input clock /IN and the code signals UP_F and UP_C constituting the signal DCA_CODE, and generates the delay clock CDLY_B.

Figure 8:
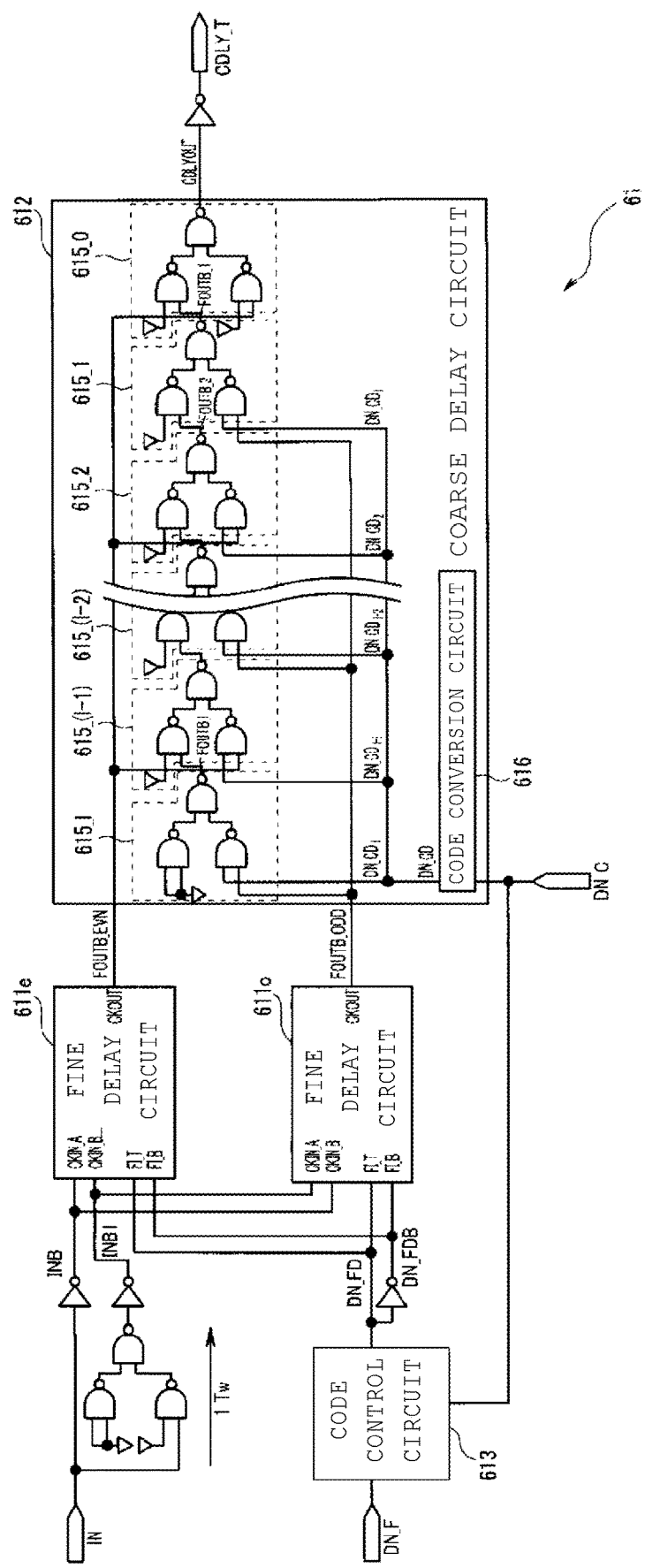
FIG. 8 is a circuit diagram illustrating a configuration example of a delay block circuit.

First, the delay block circuit 61 will be described. FIG. 8 is a circuit diagram illustrating a configuration example of the delay block circuit. The delay block circuit 61 includes two sets of fine delay circuits 611e and 611o, a coarse delay circuit 612, and a code control circuit 613.

The fine delay circuits 611e and 611o are delay circuits that correct the rising timing of the input clock IN with a resolution of 1.0 Tw time or less (specifically, a time unit of (1.0/m)Tw). The fine delay circuits 611e and 611o are delay circuits having four input terminals CKIN_A, CKIN_B, FI_T, and FI_B, and one output terminal CKOUT.

Figure 9:
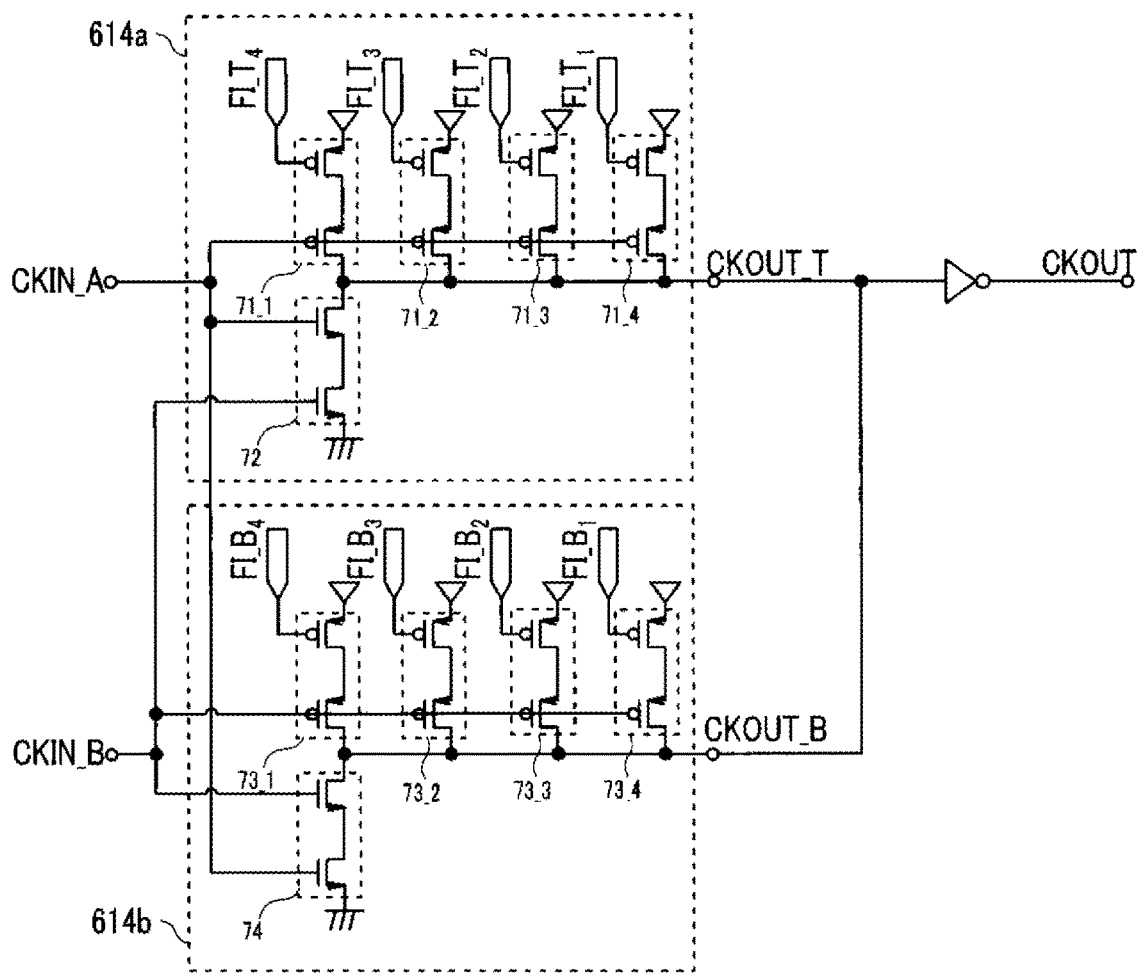
FIG. 9 is a circuit diagram illustrating a configuration example of a fine delay circuit.

FIG. 9 is a circuit diagram illustrating a configuration example of the fine delay circuit. The fine delay circuit 611e includes two sets of inverter circuits 614a and 614b. The inverter circuit 614a includes m P-side switches 71_1, 71_2, . . . , 71_m and an N-side switch 72. FIG. 9 illustrates the case where m=4. The P-side switch 71_β includes two PMOS transistors connected in series. The m P-side switches 71_β are connected in parallel between the output terminal CKOUT_T of the inverter circuit 614a and the node of the power supply potential Vcc. The N-side switch 72 includes two NMOS transistors connected in series. The N-side switch 72 is connected between the output terminal CKOUT_T of the inverter circuit 614a and the node of the ground potential Vss.

Of the two PMOS transistors constituting the P-side switch 71_β, the gate of the PMOS transistor (hereinafter, referred to as a first PMOS transistor) on the side where the drain is connected to the output terminal CKOUT_T of the inverter circuit 614a is connected to the input terminal CKIN_A. The set 1-bit data in the m-bit code signal input from the input terminal FI_T is input into the gate of the other PMOS transistor constituting the P-side switch 71_β (hereinafter, referred to as a second PMOS transistor). That is, the first bit data, the second bit data, . . . , the mth bit data of the code signal input from the input terminal FI_T are input in order from the P-side switch 71_m close to the output terminal CKOUT_T.

In the configuration illustrated in FIG. 9, the first bit data of the code signal input from the input terminal FI_T is input into the P-side switch 71_4, the second bit data of the signal is input into the P-side switch 71_3, the third bit data of the signal is input into the P-side switch 71_2, and the fourth bit data of the signal is input into the P-side switch 71_1. Specifically, when the 4-bit code signal input from the input terminal FI_T is "1110," "1 (=H)" is input into the gates of the P-side switches 71_1, 71_2, and 71_3, and "0 (=L)" is input into the gate of the second PMOS transistor of the P-side switch 71_4.

Of the two NMOS transistors constituting the N-side switch 72, the gate of the NMOS transistor on the side where the drain is connected to the output terminal CKOUT_T of the inverter circuit 614a (hereinafter, referred to as a first NMOS transistor) is connected to the input terminal CKIN_A. The gate of the other NMOS transistor constituting the N-side switch 72 (hereinafter, referred to as a second NMOS transistor) is connected to the input terminal CKIN_B.

The inverter circuit 614b includes m P-side switches 73_1, 73_2, . . . , 73_m and an N-side switch 74. The P-side switch 73_β includes two PMOS transistors connected in series. The m P-side switches 73_β are connected in parallel between the output terminal CKOUT_B of the inverter circuit 614a and the node of the power supply potential Vcc. Similar to the P-side switch 71_β, of the two PMOS transistors constituting the P-side switch 73_β, the PMOS transistor on the side where the drain is connected to the output terminal CKOUT_B of the inverter circuit 614b is referred to as a first PMOS transistor, and the other PMOS transistor is referred to as a second PMOS transistor. The N-side switch 74 includes two NMOS transistors connected in series. The N-side switch 74 is connected between the output terminal CKOUT_B of the inverter circuit 614b and the node of the ground potential Vss. Further, similar to the N-side switch 72, of the two NMOS transistors constituting the N-side switch 74, the NMOS transistor on the side where the drain is connected to the output terminal CKOUT_B of the inverter circuit 614b is referred to as a first NMOS transistor, and the other NMOS transistor is referred to as a second NMOS transistor.

Of the two PMOS transistors constituting the P-side switch 73_β, the gate of the first PMOS transistor is connected to the input terminal CKIN_B. The set 1-bit data in the m-bit code signal input from the input terminal FI_B is input into the gate of the second PMOS transistor of the P-side switch 73_β. That is, the first bit data, the second bit data, . . . , the m bit data of the code signal input from the input terminal FI_B are input in order from the P-side switch 73_m close to the output terminal CKOUT_B.

In the configuration illustrated in FIG. 9, the first bit data of the code signal input from the input terminal FI_B is input into the P-side switch 73_4, and the second bit data of the signal is input into the P-side switch 73_3, the third bit data of the signal is input into the P-side switch 73_2, and the fourth bit data of the signal is input into the P-side switch 73_1. Specifically, when the 4-bit code signal input from the input terminal FI_B is "0001," "1 (=H)" is input into the gate of the P-side switch 73_4, and "0 (=L)" is input into the gate of the second PMOS transistor of the P-side switches 73_1, 73_2, and 73_3.

Of the two NMOS transistors constituting the N-side switch 74, the gate of the first NMOS transistor is connected to the input terminal CKIN_B. The gate of the second NMOS transistor of the N-side switch 72 is connected to the input terminal CKIN_A.

The output terminal CKOUT_T of the inverter circuit 614a and the output terminal CKOUT_B of the inverter circuit 614b are electrically connected. That is, the output terminal CKOUT_T and the output terminal CKOUT_B are short-circuited. A signal PI_CLKB in which the output signal from the inverter circuit 614a and the output signal from the inverter circuit 614b are merged is logically inverted by the inverter and output from the output terminal CKOUT.

In the fine delay circuit 611e, a signal in which the logic of the input clock IN is inverted (the clock INB) is input into the input terminal CKIN_A, and a signal in which the clock INB is delayed by 1.0 Tw in time (the clock INB1) is input into the input terminal CKIN_B. Further, in the fine delay circuit 611e, a code signal DN_FD is input into the input terminal FI_T. Further, the code signal DN_FDB, which is a signal in which the code signal DN_FD is logically inverted, is input into the input terminal FI_B.

The fine delay circuit 611e receives the clock INB, the clock INB1, the code signal DN_FD, and the code signal DN_FDB, and generates the clock FOUTB_EVN. The clock FOUTB_EVN is a signal in which the rise of the input clock IN is delayed in the range of 0 to 1.0 TW based on the code signals DN_FD and DN_FDB, and the logic is inverted.

In the fine delay circuit 611o, a signal in which the logic of the input clock IN is inverted (the clock INB) is input into the input terminal CKIN_B, and a signal in which the clock INB is delayed by 1.0 Tw in time (the clock INB1) is input into the input terminal CKIN_A. Further, in the fine delay circuit 611e, a code signal DN_FD is input into the input terminal FI_T. Further, the code signal DN_FDB, which is a signal in which the code signal DN_FD is logically inverted, is input into the input terminal FI_B.

The fine delay circuit 611e receives the clock INB, the clock INB1, the code signal DN_FD, and the code signal DN_FDB, and generates the clock FOUTB_EVN. The clock FOUTB_ODD is a signal in which the rise of the input clock IN is delayed in the range of 0 to 1.0 TW based on the code signals DN_FD and DN_FDB, and the logic is inverted. The generation of the clocks FOUTB_EVN and FOUTB_ODD in the fine delay circuits 611e and 611o will be described in detail later.

The code generation circuit 613 receives the code signals DN_C and DN_F, and generates the code signal DN_FD to be input into the input terminal FI_T of the fine delay circuit 611e and the input terminal FI_T of the fine delay circuit 611o. The code signal DN_FD is an m-bit thermometer code. The generation of the code signal DN_FD in the code generation circuit 613 will be described in detail later.

The COARSE delay circuit 612 is a delay circuit that corrects the rising timing of the input clock IN in 1.0 Tw time units. The coarse delay circuit 612 receives a signal FOUTE_EVN, a signal FOUTE_ODD, and a code signal DN_C, delays a signal in which either the clock FOUTB_EVN or the clock FOUTB_ODD is selected by the amount based on the code signal DN_C, based on the code signal DN_C, and outputs the delayed signal as an output clock CDLYOUT.

The COARSE delay circuit 612 includes 1+1 delay elements 615_0 to 615_1. The delay elements 615_0 to 615_1 are arranged in the order of delay elements 615_0, 615_1, 615_2, . . . , 615_1 from the side closer to the output terminal. In each case where γ (γ is 0 and a natural number of 1 or more and less than 1) is 0 to 1, the delay element 615_γ includes, for example, three NAND gates. Hereinafter, the notation including the symbol "γ" is assumed to collectively indicate all cases in which γ is 0 or more and 1 or less. That is, the notation including the symbol "γ" is assumed to collectively indicate the case where γ is 0, the case where γ is 1, . . . , the case where γ is 1. The delay element 615_γ causes a delay equal to 1.0 Tw in time.

Further, the coarse delay circuit 612 includes a code conversion circuit 616. The code conversion circuit 616 receives the code signal DN_C included in the signal DCA_CODE output from the arithmetic circuit 42, decodes the code signal DN_C, converts a binary code into a thermometer code, and generates a code signal DN_CD. The code signal DN_CD is an l-bit code signal. For example, when the binary code "100" indicating the decimal number "4" is received as the code signal DN_C, the code conversion circuit 616 generates "0 . . . 01111" as the code signal DN_CD. That is, the code conversion circuit 616 generates a code signal DN_CD in which the first bit to the number of bits indicated by the code signal DN_C is "1" and the other bits are "0." The code conversion circuit 616 outputs the generated code signal DN_CD to the delay element 615.

The first NAND gate of the delay element 615_γ receives either the clock FOUTB_EVN or the clock FOUTB_ODD at one input. Specifically, when γ is an even number, the clock FOUTB_EVN is received, and when α is an odd number, the clock FOUTB_ODD is received. Further, the first NAND gate receives the code signal DN_CDγ (a value of the γth bit of the code signal DN_CD) at the other input. However, in the delay element 615_0, the first NAND gate is connected to the node of the power potential Vcc at the other input.

The second NAND gate of the delay element 615_γ receives the signal FOUTB_(γ+1) output from the delay element 615 (γ+1) at one input. The second NAND gate is also connected to a node having a power potential Vcc at another input. However, the second NAND gate of the delay element 615_n is grounded at the two inputs, that is, connected to a node having a ground potential Vss.

The third NAND gate of the delay element 615_γ receives the output of the first NAND gate and the output of the second NAND gate, and outputs a signal FOUTB_γ.

When the value of the code signal DN_CDγ input into the first NAND gate is "0 (=L)," the delay element 615_γ outputs "0 (=L)" as the signal FOUTB_γ. Meanwhile, when the value of the code signal DN_CDγ input into the first NAND gate is "1 (=H)," the signal FOUTB_(γ+1) input into the second NAND gate as the signal FOUTB_γ is output with a delay of 1.0 Tw in time. The signal FOUTB_0 output from the delay element 615_0 is output from the coarse delay circuit 612 as the output clock CDLYOUT.

The output clock CDLYOUT is logically inverted by the inverter and output from the delay block circuit 61 as the delay clock CDLY_T.

The delay block circuit 62 has the same configuration as the delay block circuit 61 described above. However, the input/output signal is different from that of the delay block circuit 61. That is, the delay block circuit 61 receives the input clock IN and the code signals DN_F and DN_C constituting the signal DCA_CODE and generates the delay clock CDLY_T, whereas the delay block circuit 62 receives the input clock /IN and the code signals UP_F and UP_C constituting the signal DCA_CODE, and generates the delay clock CDLY_B.

The waveform generation circuit 44 is a circuit that generates an output clock OUT that maintains a high level over a period from the rise (rising edge) of the delay clock CDLY_T to the rise (rising edge) of the delay clock CDLY_B. The waveform generation circuit 44 is configured as a multiplexer as a two-input, one-output multiplexer having two signals of, for example, a delay clock CDLY_T and a delay clock CDLY_B as inputs and an output clock OUT as an output (a multiplexer that outputs the logical product of the delay clock CDLY_T and the inverted signal of the delay clock CDLY_B).

(1-3-4. Configuration of Waveform Generation Circuit)

Figure 10:
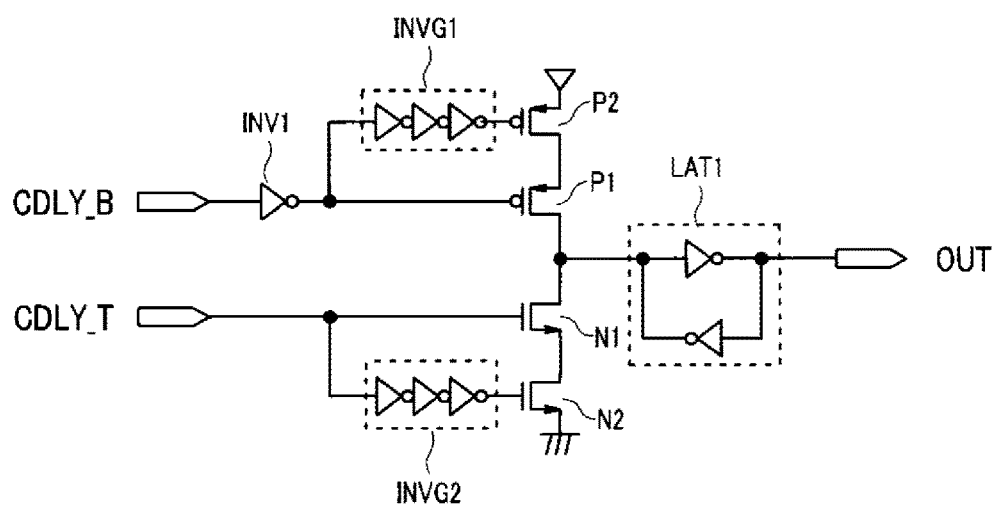
FIG. 10 is a circuit diagram illustrating a configuration example of a waveform generation circuit.

FIG. 10 is a circuit diagram illustrating a configuration example of a waveform generation circuit. The waveform generation circuit 44 of the embodiment includes an inverter INV1, inverter groups INVG1 and INVG2 in which a plurality of inverters is connected in series, PMOS transistors P1 and P2, NMOS transistors N1 and N2, and a latch circuit LAT1.

The PMOS transistors P2 and P1 and the NMOS transistors N1 and N2 are connected in series. The source of the PMOS transistor P2 is connected to the power supply potential Vcc, and the source of the NMOS transistor N2 is connected to the ground potential Vss. The delay clock CDLY_B is logically inverted via the inverter IN1 and input into the gate of the PMOS transistor P1 and the inverter group INVG1. The output of the inverter group INVG1 is input into the gate of the PMOS transistor P2. The delay clock CDLY_T is input into the gate electrode of the NMOS transistor N2 and the inverter group INVG2. The output of the inverter group INVG2 is input into the gate of the NMOS transistor N2.

A connection point between the drain of the PMOS transistor P1 and the drain of the NMOS transistor N2 is connected to the input of the latch circuit LAT1. The latch circuit LAT2 has a configuration in which two inverters are positively fed back.

When the delay clock CDLY_B input into the waveform generation circuit 44 is switched from the low level to the high level, the PMOS transistors P1 and P2 are turned on, and the power supply potential Vcc is input into the latch circuit LAT1. Meanwhile, when the delay clock CDLY_T input into the waveform generation circuit 44 is switched from the low level to the high level, the NMOS transistors N1 and N2 are turned on, and the ground potential Vss is input into the latch circuit LAT1. Therefore, the signal output from the latch circuit LAT1 (i.e., the output clock OUT) becomes a clock signal which is switched from a low level to a high level at the rising edge of the delay clock CDLY_T, and is switched from a high level to a low level at the rising edge of the delay clock CDLY_B.

The waveform generation circuit 44 outputs the signal output from the latch circuit LAT1 as the output clock OUT. In addition, a signal in which the logic of the output clock OUT is inverted (i.e., the output clock /OUT) is also generated and output. The output clocks OUT and /OUT are output from the DCC circuit 20 and input into the DCD circuit 41. The output clock OUT is input into the DCD circuit 41 as an input clock DCD_IN, and the output clock /OUT is input into the DCD circuit 41 as an input clock /DCD_IN.

(2. Operation)

(2-1. Operation of DCC Circuit)

Figure 11:
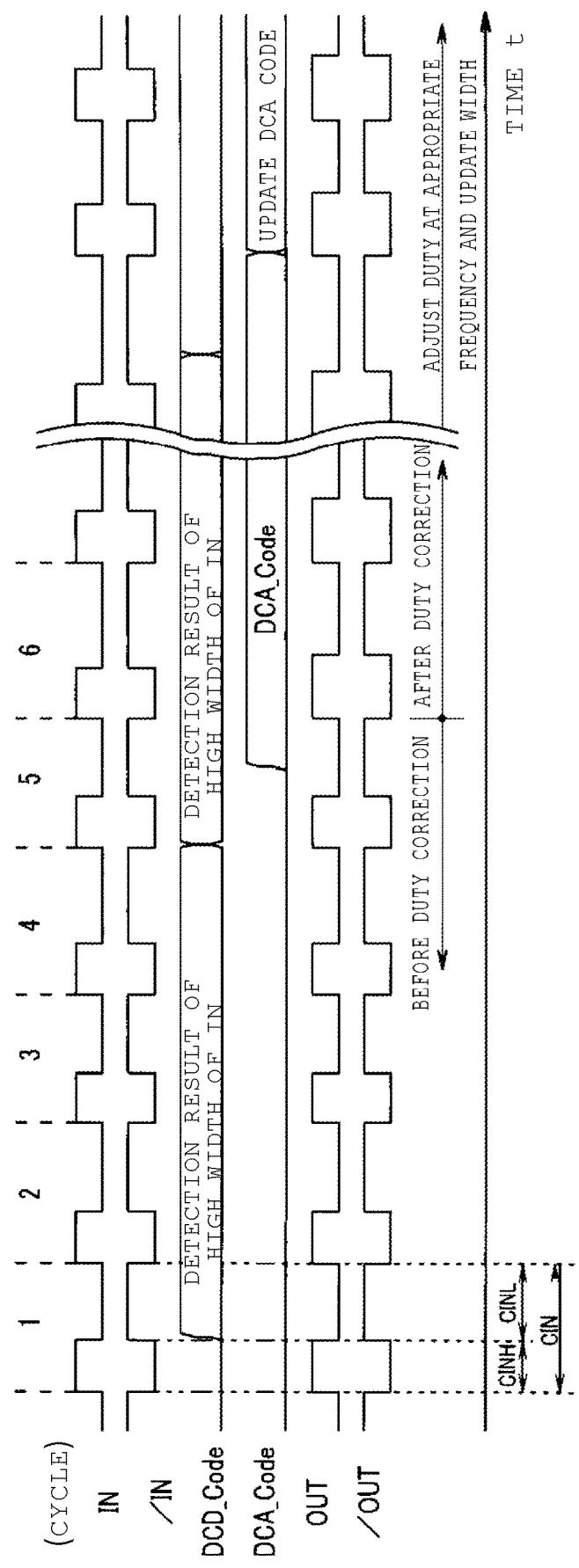
FIG. 11 is a timing chart illustrating an example of the operation of a DCC circuit.

FIG. 11 is a timing chart illustrating an example of the operation of a DCC circuit. As illustrated in FIG. 11, the input clock IN input into the DCC circuit 20 has a certain duty cycle. For example, the duty cycle is not 50% and the high-level period (i.e., the period CINH) is shorter than the low-level period (i.e., the period CINL). The input clock IN has a cycle CIN, is at a high level over the period CINH, and is at a low level over the period CINL. That is, the input clock IN has a relationship of CIN=CINH+CINL and CINH<CINL.

The duty of the input clock IN input into the DCC circuit 20 is detected in the DCD circuit 41 in the first few cycles (e.g., 5 cycles). Specifically, the DCD circuit 41 measures the pulse width (i.e., the high-level period) of the first cycle of the input clock DCD_IN, generates a signal DCD_CODE, and outputs the signal DCD_CODE to the arithmetic circuit 42. Further, the DCD circuit 41 measures the pulse width of the fourth cycle of the input clock /DCD_IN, generates a signal DCD_CODE, and outputs the signal DCD_CODE to the arithmetic circuit 42. In the cycle before the duty correction of the input clocks IN and /IN is performed, the output clocks OUT and /OUT have the same duty as the input clocks IN and /IN. Therefore, the duties of the input clocks DCD_IN and /DCD_IN are equal to the duties of the input clocks IN and /IN. That is, in the signal DCD_CODE output from the DCC circuit 20, the period from the fall of the first cycle of the input clock IN (i.e., the rise of the first cycle of the input clock /IN) to the fall of the fourth cycle of the input clock /IN (i.e., the rise of the fifth cycle of the input clock IN) is a value generated based on the detection result of the pulse width in the first cycle of the clock IN. Also, the predetermined period from the fall of the fourth cycle of the input clock /IN (i.e., the rise of the fifth cycle of the input clock IN) is a value generated based on the detection result of the pulse width in the fourth cycle of the input clock /IN.

When both the detection result of the pulse width of the input clock IN and the detection result of the pulse width of the input clock /IN are received by the signal DCD_CODE, the arithmetic circuit 42 compares the detection results with each other. Then, a signal DCA_CODE is generated based on the comparison results. For example, when receiving the detection result of the pulse width of the input clock IN from the fall of the first cycle of the input clock IN, and receiving the detection result of the pulse width of the input clock /IN from the rise of the fifth cycle of the input clock IN, the signal DCA_CODE is generated and output during the fifth cycle of the input clock IN.

Then, in the DCA circuit 43 and the waveform generation circuit 44, the duties of the input clocks IN and /IN are corrected based on the signal DCA_CODE, and the output clocks OUT and /OUT are output from the DCC circuit 20. For the cycles (1st to 5th cycles) before the signal DCA_CODE is generated, the input clocks IN and /IN are not corrected and become the output clocks OUT and /OUT. The duty of the input clock IN is corrected based on the signal DCA_CODE received during the fifth cycle of the input clock IN. Then, the DCC circuit 20 of the corrected clock signal outputs the signal from the sixth cycle of the output clock OUT.

The output clocks OUT and /OUT are fed back to the DCD circuit 41 as input clocks DCD_IN and /DCD_IN, respectively. The DCD circuit 41 measures the pulse width of the input clock DCD_IN and the pulse width of the input clock /DCD_IN at a set appropriate interval, and updates the signal DCD_CODE. When the signal DCD_CODE is updated, the arithmetic circuit 42 updates the signal DCA_CODE. Then, in the DCA circuit 43 and the waveform generation circuit 44, the duties of the input clocks IN and /IN are corrected based on the updated signal DCA_CODE, and the output clocks OUT and /OUT are output from the DCC circuit 20.

As described above, according to the present embodiment, even after the duty correction of the input clocks IN and /IN, the output clocks OUT and /OUT are fed back to the DCD circuit 41 to continue monitoring and updating the signal DCD_CODE. As a result, even when the duties of the input clocks IN and /IN change due to fluctuations in temperature and voltage during operation of the semiconductor storage device 2, the duties may be appropriately corrected by following the fluctuations. Further, when detecting the signal DCD_CODE, even when a temporary error occurs due to disturbance such as noise, the number of detections of the signal DCD_CODE may be increased by continuously detecting the signal DCD_CODE, and the error may be averaged to reduce the influence. Further, it is possible to eliminate the error caused by a characteristic difference between the delay element 521_$\alpha$ provided in the DCD circuit 41 and the delay element 615_$\gamma$ provided in the DCA circuit 43.

(2-1-1. Operation of DCD Circuit)

Figure 12:
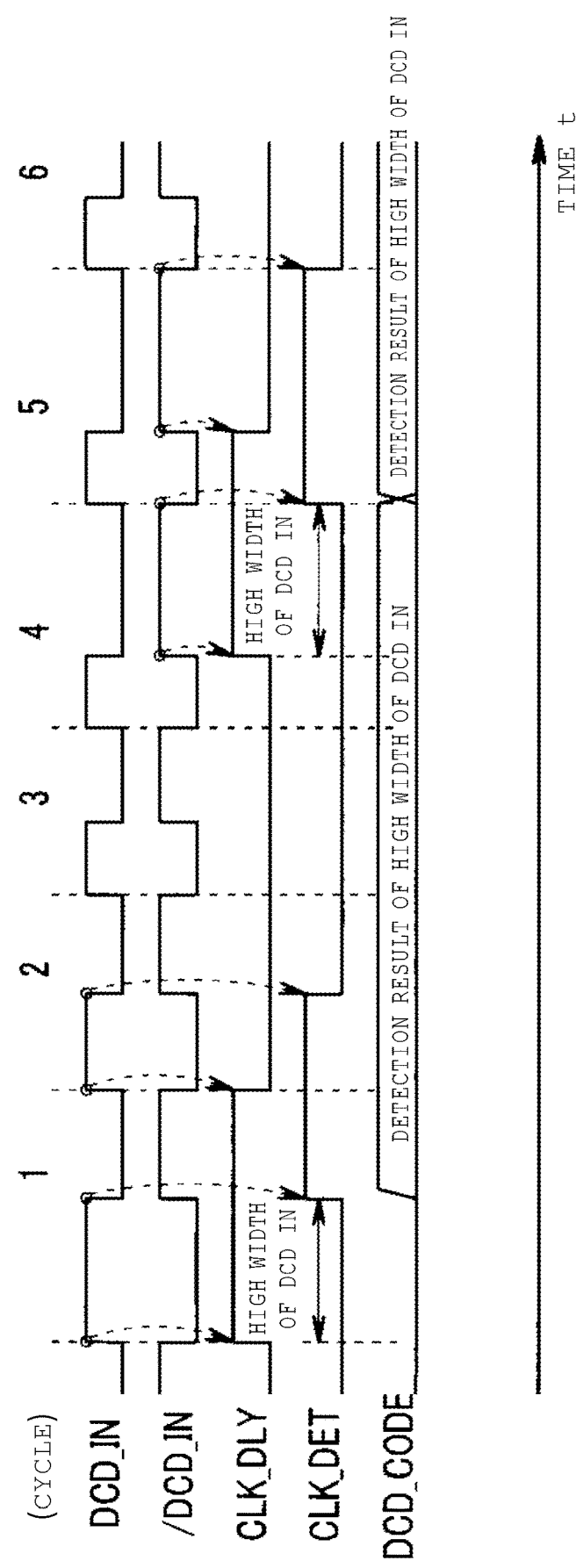
FIG. 12 is a timing chart illustrating an example of the operation of a DCD circuit.
Figure 13:
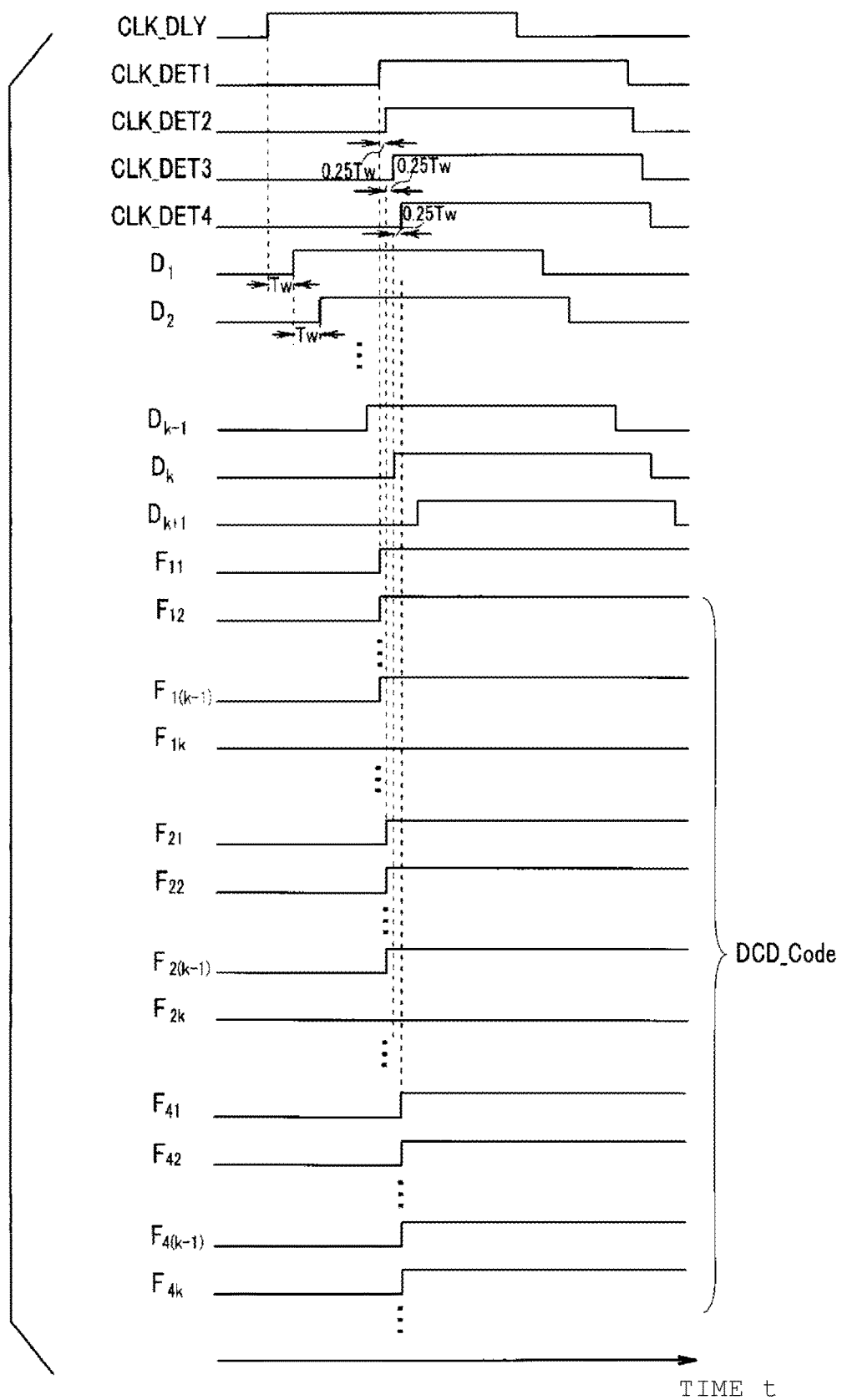
FIG. 13 is a timing chart illustrating an example of the operation of a DCD circuit.

FIGS. 12 and 13 are timing charts illustrating an example of the operation of a DCD circuit. Input clocks DCD_IN and /DCD_IN are input into the DCD circuit 40. The signal generation circuit 51 detects the rise of the first cycle of the input clock DCD_IN, and maintains the signal CLK_DLY at a high level during the same period as the period from this rise to the rise of the next cycle of the input clock DCD_IN. Further, the signal generation circuit 51 detects the rise of the fourth cycle of the input clock /DCD_IN (i.e., the fall of the fourth cycle of the input clock DCD_IN), and maintains the signal CLK_DLY at a high level during the same period as the period from this rise to the rise of the next cycle of the input clock /CLK_DLY.

The signal generation circuit 51 detects the fall of the first cycle of the input clock DCD_IN, and maintains the signal CLK_DET at a high level during the same period as the period from this fall to the fall of the next cycle of the input clock DCD_IN. Further, the signal generation circuit 51 detects the fall of the fourth cycle of the input clock /DCD_IN (i.e., the rise of the fifth cycle of the input clock DCD_IN), and maintains the signal CLK_DET at a high level during the same period as the period from this fall to the fall of the next cycle of the input clock /DCD_IN.

Further, each time a predetermined timing is set or every time duty adjustment is required, the signal generation circuit 51 repeats the above-mentioned operations for the signals CLK_DLY and CLK_DET. That is, the high-level period in the odd cycle of the signal CLK_DLY has the same length as one cycle of the input clock CLK_IN, and the high-level period in the even cycle has the same length as one cycle of the input clock /CLK_IN. Further, the high-level period in the odd cycle of the signal CLK_DET has the same length as one cycle of the input clock CLK_IN, and the high-level period in the even cycle has the same length as one cycle of the input clock /CLK_IN.

In the signal CLK_DLY and the signal CLK_DET generated as described above, the period from the rise of the odd cycle of the signal CLK_DLY to the rise of the signal CLK_DET is the same period as the pulse width of the input clock DCD_IN. Further, the period from the rise of the even cycle of the signal CLK_DLY to the rise of the signal CLK_DET is the same period as the pulse width of the input clock /DCD_IN.

The delay element array circuit 52 uses the signal CLK_DLY received from the signal generation circuit 51 as a signal D0, and generates and outputs the signal D$\alpha$ in each delay element 521_$\alpha$ based on the signal D0. That is, the delay element 521_$\alpha$ outputs a signal in which the signal D($\alpha$−1) is delayed by the time Tw as the signal D$\alpha$. In this way, the signals D1 to Dn delayed by the time Tw may be obtained in ascending order of the value of $\alpha$. FIG. 13 illustrates a part of signals D1 to D(k+1) (k is a natural number of n−1 or less).

A signal whose clock signal CLK_DET is delayed by $\{1.0+(\beta-1)/m\} \times Tw$ in time is supplied to the delay line 53$\beta$ of the edge detection circuit 53 as the clock signal DLK_DET$\beta$.

For example, as illustrated in FIG. 6, when the edge detection circuit 53 is provided with four delay lines (m=4), a signal obtained by delaying the clock signal CLK_DET by 1.0 Tw in time (i.e., the clock signal CLK_DET1) is supplied to the delay line 531. Similarly, a signal in which the clock signal CLK_DET is delayed by 1.25 Tw in time (i.e., the clock signal CLK_DET2) is supplied to the delay line 532, and a signal in which the clock signal CLK_DET is delayed by 1.5 Tw in time (i.e., the clock signal CLK_DET3) is supplied to the delay line 533. Further, a signal in which the clock signal CLK_DET is delayed by 1.75 Tw in time (i.e., clock signal CLK_DET4) is supplied to the delay line 534.

The flip-flop 53$\beta$_$\alpha$ provided on the delay line 53$\beta$ latches the signal D$\alpha$ in response to the transition of the clock signal CLK_DET$\beta$ to a high level, and outputs the latched signal D$\alpha$ as the signal F$\beta\alpha$.

For example, as illustrated in FIG. 13, in the delay line 531, when the signals D1 to D(k−1) are at the high level and the signals Dk to Dn are at the low level at the timing when the clock signal CLK_DET1 is switched to the high level, high-level signals are output as signals F11 to F1(k−1) from flip-flops 531_1 to 531_(k−1), and low-level signals are output as signals F1k to F1n from flip-flops 531_k to 531_n.

In the delay line 532, when the signals D1 to D(k−1) are at the high level and the signals Dk to Dn are at the low level at the timing when the clock signal CLK_DET2 is switched to the high level, high-level signals are output as signals F21 to F2 (k−1) from the flip-flops 532_1 to 532_(k−1). Low-level signals are output as signals F2k to F2n from the flip-flops 532_k to 532_n.

In the delay line 533, when the signals D1 to D(k−1) are at the high level and the signals Dk to Dn are at the low level at the timing when the clock signal CLK_DET3 is switched to the high level, although not illustrated in the figure, high-level signals are output as signals F31 to F3(k−1) from the flip-flops 533_1 to 533 (k−1). Low-level signals are output as signals F3k to F3n from the flip-flops 533_k to 533_n.

In the delay line 534, when the signals D1 to Dk are at the high level and the signals D(k+1) to Dn are at the low level at the timing when the clock signal CLK_DET4 is switched to the high level, high-level signals are output as signals F41 to F4k from the flip-flops 5343_1 to 534_k. Although not illustrated in the figure, low-level signals are output from the flip-flops 534 (k+1) to 534_n as signals F4(k+1) to F4n.

The signal Fβα output from the delay line 53β is output as the signal DCD_CODE. For example, when n=8 and k=5, the signal Fβα according to the timing chart illustrated in FIG. 13 is obtained as follows. That is, a signal of 32 (=8 bits×4) bits in which the signals F1n to F11 are "00001111," the signals F2n to F21 are "00001111," the signals F3n to F31 are "00001111," and the signals F4n to F41 "00011111" is obtained. The edge detection circuit 53 generates and outputs the signal DCD_CODE of 32 bits (=n×m bits) by arranging the signals Fβα in order. For example, in the above case, the signal DCD_CODE becomes "00001111000011110000111100011111."

(2-1-2. Operation of Arithmetic Circuit)

The arithmetic circuit 42 counts the number of high-level bits i of the signal DCD_CODE received from the DCD circuit 41 in the first cycle of the clock signal CLK_DET. For example, when the signal DCD_CODE is "00001111000011110000111100011111," the number of high-level bits is counted as "i=17." Further, the arithmetic circuit 42 counts the number of high-level bits j of the signal DCD_CODE received from the DCD circuit 41 in the next cycle of the clock signal CLK_DET. For example, when the signal DCD_CODE is "01111111111111111111111111111111," the number of high-level bits is counted as "j=31."

The number "i" represents the pulse width (high-level period) of the input clock IN. Specifically, the product of the value obtained by dividing the number i by m and the delay time Tw expresses the high-level width of the input clock IN. For example, when i=17, the high-level width of the input clock IN is (17/4)×Tw=4.25 Tw.

The number "j" represents the pulse width (high-level period) of the input clock /IN. Specifically, the product of the value obtained by dividing the number j by m and the delay time Tw expresses the high-level width of the input clock /IN. The high-level width of the input clock /IN is equal to the low-level width of the input clock IN. Therefore, the number j represents the low-level width of the input clock IN. For example, when i=31, the low-level width of the input clock IN is (31/4)×Tw=7.75 Tw.

Figure 14:
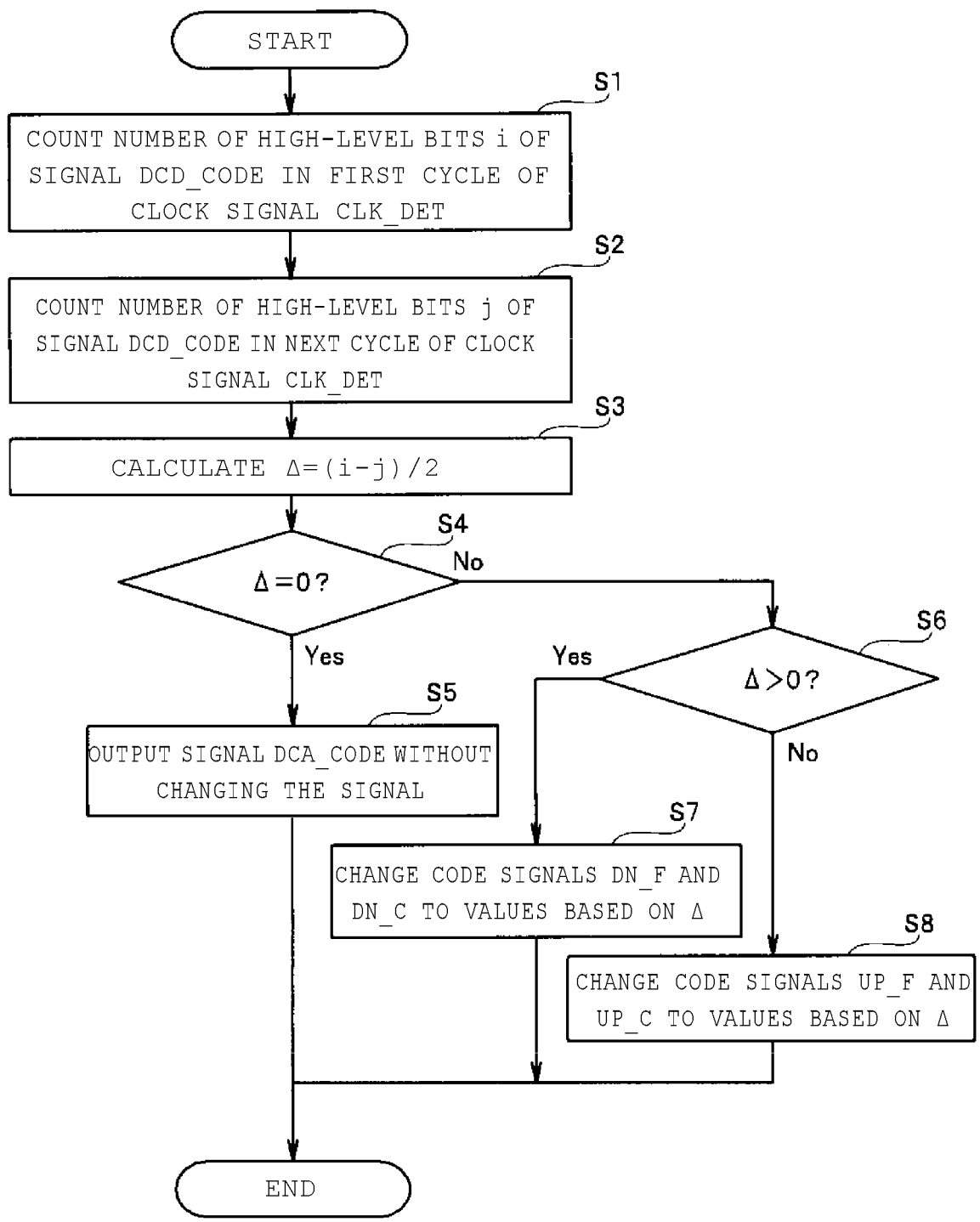
FIG. 14 is a flowchart illustrating the operation of an arithmetic circuit.

FIG. 14 is a flowchart illustrating the operation of the arithmetic circuit. The arithmetic circuit 42 counts the number of high-level bits of the signal DCD_CODE in the first cycle of the clock signal CLK_DET, and acquires the number i which is the counting result (step S1). Subsequently, the arithmetic circuit 42 counts the number of high-level bits of the signal DCD_CODE in the next cycle of the clock signal CLK_DET, and acquires the number j which is the counting result (step S2).

Figures 15, 16:
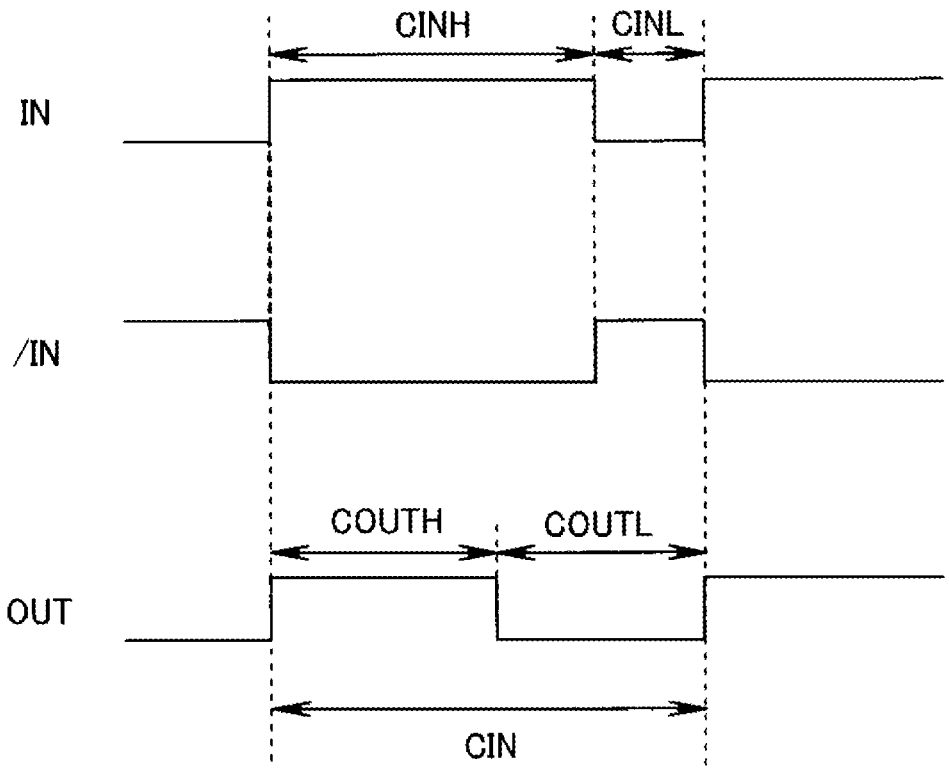
FIG. 15 is a waveform diagram illustrating an example of an input clock and an output clock of a DCC circuit.
FIG. 16 illustrates an example of the value of a code signal DN_F.

The arithmetic circuit 42 calculates $\Delta=(i+j)/2$ by using the number i acquired in S1 and the number j acquired in S2 (step S3). FIG. 15 is a waveform diagram illustrating an example of an input clock and an output clock of the DCC circuit. As described above and as illustrated in FIG. 15, the number i indicates the high-level period of the input clock IN, and the number j indicates the low-level period of the input clock IN. Therefore, difference i−j is a difference between the high-level period and the low-level period of the input clock IN. Then, $\Delta$ is equal to the difference between the high-level (or the low-level) period TOUTH in the output clock OUT having the same cycle CIN as the cycle CIN of the input clock IN and having a duty ratio of 50%, and the high-level period CINH (or the low-level period CINL) of the input clock IN. FIG. 15 illustrates an example in which i and j are different from each other.

Referring back to FIG. 14, the arithmetic circuit 42 determines whether $\Delta$ is 0 (step S4). When it is determined that $\Delta$ is 0 ("Yes" in step S4), the arithmetic circuit 42 outputs the signal DCA_CODE as it is without changing the signal (step S5). The signal DCA_CODE includes code signals DN_F and DN_C, and code signals UP_F and UP_C. The code signals DN_F and DN_C are signals for setting the delay amount of the fall of the input clock IN, and the code signals UP_F and UP_C are signals for setting the delay amount of the rise of the input clock IN. The code signal DN_F is an m-bit signal, and instructs a delay in the fall of the input clock IN with a resolution of 1.0 Tw time or less (specifically, (1.0/m) Tw time unit). The code signal DN_C is an 1-bit signal, and instructs a delay in the fall of the input clock IN in units of 1.0 Tw time. The code signal UP_F is an m-bit signal, and instructs a delay in the rise of the input clock IN with a resolution of 1.0 Tw time or less (specifically, (1.0/m) Tw time unit). The code signal UP_C is an 1-bit signal, and instructs a delay in the rise of the input clock IN in 1.0 Tw time units. The code signals DN_F and DN_C, and the code signals UP_F and UP_C are all set to "0" bit (a setting that instructs a delay by a minimum delay time Tf in the fine delay circuit 611) in the default state.

In the present embodiment, the delay amount adjustment of the signal DCD_IN (i.e., the output clock OUT) is repeatedly performed in the DCC circuit 20. When a certain delay amount has already been set in the signal DCA_CODE in the second and subsequent delay amount adjustments (when "1" is set in one or more bits in any of the code signals DN_F and DN_C, and the code signals UP_F and UP_C), the arithmetic circuit 42 outputs the signal DCA_CODE as it is without returning the signal DCA_CODE to the default state in step S5.

Meanwhile, in step S4, when it is determined that $\Delta$ is not 0 ("No" in step S4), the arithmetic circuit 42 determines whether $\Delta$ is a positive number ($\Delta>0$) (step S6). When it is determined that $\Delta$ is a positive number ("Yes" in step S6), the arithmetic circuit 42 changes the code signals DN_F and DN_C to values based on $\Delta$ (step S7). Specifically, the code signals DN_F and DN_C are set to values instructing the rise of the input clock IN to be delayed by the period represented by $\Delta$. Then, the arithmetic circuit 42 outputs a signal DCA_CODE including the changed code signals DN_F and DN_C and the unchanged code signals UP_F and UP_C.

Meanwhile, in step S6, when it is determined that Δ is not a positive number (Δ<0) ("No" in step S6), the arithmetic circuit 42 changes the code signals UP_F and UP_C to values based on Δ (step S8). Specifically, the code signals UP_F and UP_C are set with values instructing the fall of the input clock IN to be delayed by the period represented by Δ. Then, the arithmetic circuit 42 outputs a signal DCA_CODE including the changed code signals UP_F and UP_C and the unchanged code signals DN_F and DN_C.

Although not illustrated in FIG. 14, in the second and subsequent delay amount adjustments, if a certain delay is already set for the code signals UP_F and UP_C when Δ>0, adjustments may be performed to reduce the values of the code signals UP_F and UP_C.

FIG. 16 illustrates an example of the value of the code signal DN_F. Further, FIG. 17 illustrates an example of the value of the code signal DN_C. FIG. 16 relates to an example when m is 4, and FIG. 17 relates to an example when l is 7. As illustrated in FIG. 16, the code signal DN_F includes three-digit bits. The value of each bit of the code signal DN_F instructs that the time (u×Tw) obtained by multiplying the value u of the code signal value expressed in decimal by the unit delay time (0.25 Tw when m=4) in the fine delay circuit 611 delay the rise of the input clock IN input into the fine delay circuit 611 of the delay block circuit 61.

For example, the value "000" of the code signal DN_F instructs that the rise of the input clock IN input into the fine delay circuit 611 of the delay block circuit 61 be delayed by 0.00 Tw with respect to the minimum delay time Tf. Further, the value "001" of the code signal DN_F instructs that the rise of the input clock IN in the fine delay circuit 611 of the delay block circuit 61 be delayed by 0.25 Tw with respect to the minimum delay time Tf. Similarly, the values "010," "011," and "100" of the code signal DN_F instruct that the rise of the input clock IN input into the fine delay circuit 611 of the delay block circuit 61 be delayed by 0.50 Tw, 0.75 Tw, and 1.00 Tw, respectively, with respect to the minimum delay time Tf.

As illustrated in FIG. 17, the code signal DN_C includes three-digit bits. The value of each bit of the code signal DN_C instructs that the time (v×Tw) obtained by multiplying the value v of the code signal value expressed in decimal by the unit delay time (=1 Tw) in the coarse delay circuit 612 delay the rise of the clock signals input into the coarse delay circuit 612 (i.e., the clock FOUTB_EVN and the clock FOUTB_ODD).

For example, the value "000" of the code signal DN_C instructs that the rise of the clock signal input into the coarse delay circuit 612 of the delay block circuit 61 be delayed by 0 Tw. Further, the value "001" of the code signal DN_C instructs that the rise of the clock signal input into the coarse delay circuit 612 of the delay block circuit 61 be delayed by 1 Tw. Similarly, the values "010," "011," "100," "101," "110," and "111" of the code signal DN_C instruct that the rise of the clock signal input into the coarse delay circuit 612 of the delay block circuit 61 be delayed by 2 Tw, 3 Tw, 4 Tw, 5 Tw, 6 Tw, and 7 Tw, respectively.

The code signal UP_F includes bits having the same number of digits as the code signal DN_F. The value of each bit of the code signal UP_F instructs that the time (u×Tw) obtained by multiplying the value u of the code signal value expressed in decimal by the unit delay time in the fine delay circuit of the delay block circuit 62 (0.25 Tw when m=4) delay the rise of the input clock /IN input into the fine delay circuit of the delay block circuit 62.

For example, the value "000" of the code signal UP_F instructs that the rise of the input clock /IN input into the fine delay circuit of the delay block circuit 62 be delayed by 0.00 Tw with respect to the minimum delay time Tf. Further, the value "001" of the code signal UP_F instructs that the rise of the input clock /IN in the fine delay circuit of the delay block circuit 62 be delayed by 0.25 Tw with respect to the minimum delay time Tf. Similarly, the values "010," "011," and "100" of the code signal UP_F instruct that the rise of the input clock /IN input into the fine delay circuit 611 of the delay block circuit 62 be delayed by 0.50 Tw, 0.75 Tw, and 100 Tw, respectively, with respect to the minimum delay time Tf.

The code signal UP_C includes bits having the same number of digits as the code signal DN_C. The value of each bit of the code signal UP_C instructs that the time (v×Tw) obtained by multiplying the value v of the code signal value expressed in decimal by the unit delay time (=1 Tw) in the coarse delay circuit delay the rise of the clock signals input into the coarse delay circuit (i.e., the clock FOUTB_EVN and the clock FOUTB_ODD).

That is, the values "000," "001," "010," "011," "100," "101," "110," and "111" of the code signal UP_C instruct that the rise of the clock signals input into the coarse delay circuit of the delay block circuit 62 be delayed by 0 Tw, 1 Tw, 2 Tw, 3 Tw, 4 Tw, 5 Tw, 6 Tw, and 7 Tw, respectively.

Here, a method of setting the signal DCA_CODE from Δ will be described. First, a quotient q and a remainder r are calculated by dividing the absolute value of Δ by m. Then, when Δ>0, the code signal UP_C is set from the value q, and the code signal UP_F is set from the value r. When Δ<0, the code signal DN_C is set from the value q, and the code signal DN_F is set from the value r. For example, in the case of m=4 and Δ=7, since 7/4=1 remainder 3, the code signal UP_C is set as the binary code "001" indicating the decimal number "1," and the code signal UP_F is set as the binary code "011" indicating the decimal number "3." Further, for example, in the case of m=4 and A–9, since |–9|/4=2 remainder 1, the code signal DN_C is set as the binary code "010" indicating the decimal number "2," and the code signal DN_F is set as the binary code "001" indicating the decimal number "1."

(2-1-3. Operation of DCA Circuit)

Upon receiving the signal DCA_CODE output from the arithmetic circuit 42, the DCA circuit 43 generates the code signals DN_FD and DN_CD, and the code signals UP_FD and UP_CD. Specifically, the delay block circuit 61 receives the code signals DN_F and DN_C and sets the code signals DN_FD and DN_CD. Further, the delay block circuit 62 receives the code signals UP_F and UP_C and sets the code signals UP_FD and UP_CD. First, the code setting in the delay block circuit 61 will be described.

Setting of the code signal DN_FD in the code control circuit 613 will be described with reference to FIG. 18. FIG. 18 illustrates an example of the value of the code signal DN_FD. FIG. 18 relates to an example in the case of m=4. As illustrated in FIG. 18, the code signal DN_FD includes four-digit bits. Further, the code signal DN_FD is represented by a thermometer code. When the code signal DN_C is an even number (0, 2, 4, . . . ), the code signal DN_FD is set as follows according to the value of the code signal DN_F. That is, when the code signal DN_F is "000," the code signal DN_FD is set to "0000." When the code signal DN_F is "001," the code signal DN_FD is set to "0001." Similarly, when the code signal DN_F is "010," "011," and "100," the code signal DN_FD is set to "0011," "0111," and "1111," respectively.

Meanwhile, when the code signal DN_C is an odd number (1, 3, 5, . . . ), the code signal DN_FD is set as follows according to the value of the code signal DN_F. That is, when the code signal DN_F is "000," the code signal DN_FD is set to "1111." When the code signal DN_F is "001," the code signal DN_FD is set to "0111." Similarly, when the code signal DN_F is "010," "011," and "100," the code signal DN_FD is set to "0011," "0011," and "0000," respectively.

Next, the setting of the code signal DN_CD in the code conversion circuit 616 of the coarse delay circuit 612 will be described with reference to FIG. 19. FIG. 19 illustrates an example of the value of the code signal DN_CD. FIG. 19 relates to an example when 1 is 7. As illustrated in FIG. 19, the code signal DN_CD includes seven-digit bits. The code signal DN_CD is set to a value obtained by converting the decimal value represented by the code signal DN_C, which is a binary code, into a thermometer code. That is, when the code signal DN_C is "000," the code signal DN_CD is set to "00000000." When the code signal DN_C is "001," the code signal DN_CD is set to "0000001." Similarly, when the code signal DN_C is "010," "011," "100," "101," "110," and "111," the code signal DN_CD is "0000011," "0000111," "0001111," "0011111," "0111111," and "1111111," respectively.

The delay block circuit 62 receives the code signals UP_F and UP_C and sets the code signals UP_FD and UP_CD in the same manner as the delay block circuit 61. That is, in the above description, the code signals UP_F, DN_C, DN_FD, and DN_CD are changed to the code signals UP_F, UP_C, UP_FD, and UP_CD, respectively, so that the code signals UP_FD and UP_CD are set in the delay block circuit 62.

Figures 20, 21:
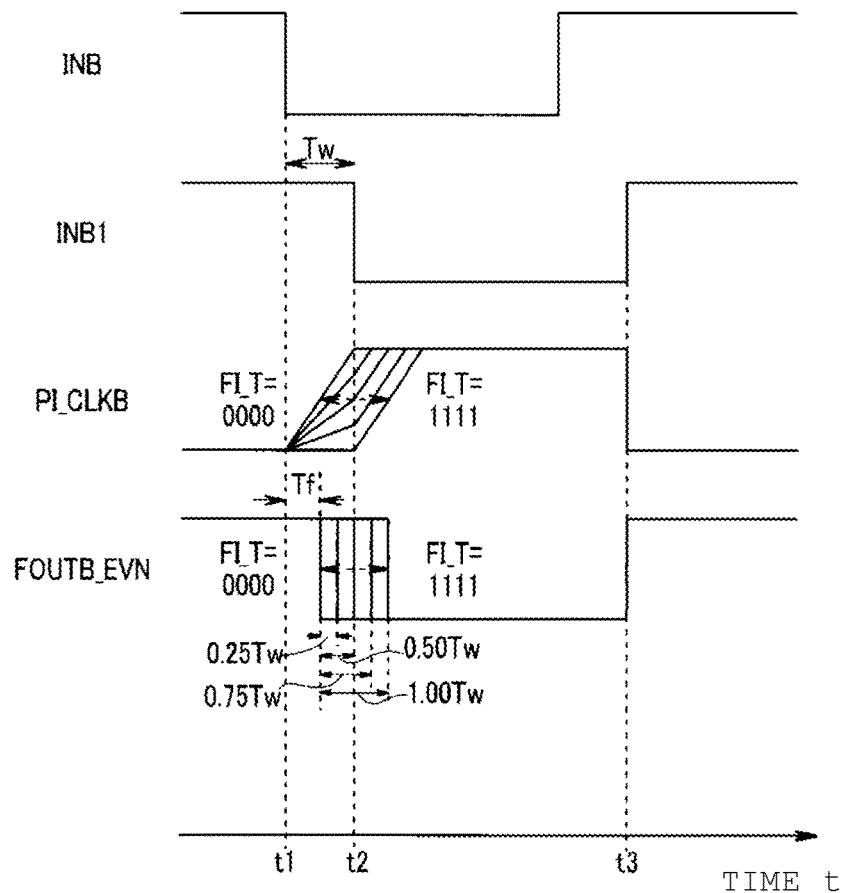
FIG. 20 is a timing chart illustrating an operation in a fine delay circuit.
FIG. 21 is a diagram illustrating a relationship between code signals DN_FB and DN_FDB and delay times of a clock FOUTB_EVN and a clock FOUTB_ODD.

Next, the operation in the fine delay circuit 611 will be described. First, the operation in the fine delay circuit 611e will be described. FIG. 20 is a timing chart of the operation in the fine delay circuit. FIG. 20 relates to the case of m=4. In the fine delay circuit 611e, a signal in which the input clock IN is logically inverted (a clock INB) is input into the input terminal CKIN_A, and a signal in which the clock INB is delayed by 1.0 Tw in time (a clock INB1) is input into the input terminal CKIN_B. Further, in the fine delay circuit 611e, the code signal DN_FD is input into the input terminal FI_T. Also, the code signal DN_FDB, which is a signal in which the code signal DN_FD is logically inverted, is input into the input terminal FI_B.

The value of the first bit of the code signal DN_FD is input into the input terminal FI_T1. Further, the value of the second bit of the code signal DN_FD is input into the input terminal FI_T2. Similarly, the values of the third and fourth bits of the code signal DN_FD are input into the input terminals FI_T3 and FI_T4, respectively.

The value of the first bit of the code signal DN_FDB is input into the input terminal FI_B1. Further, the value of the second bit of the code signal DN_FDB is input into the input terminal FI_B2. Similarly, the values of the third and fourth bits of the code signal DN_FDB are input into the input terminals FI_B3 and FI_B4, respectively.

For example, when the value of the code signal DN_FD is "0111," "1," "1," "1", and "0" are input into the input terminals FI_T1, FI_T2, FI_T3, and FI_T4, respectively. When the value of the code signal DN_FD is "0111," the value of the code signal DN_FDB is "1000." Therefore, "0," "0," "0," and "1" are input into the input terminals FI_B1, FI_B2, FI_B3, and FI_B4, respectively.

During the period when the clock INB is at a high level, the first NMOS transistor of the inverter circuit 614a and the second NMOS transistor of the inverter circuit 614b are turned on. Further, during the period when the clock INB1 is at a high level, the second NMOS transistor of the inverter circuit 614a and the first NMOS transistor of the inverter circuit 614b are turned on. Therefore, during the period when both the clock INB and the clock INB1 are at a high level, since the N-side switch 72 of the inverter circuit 614a and the N-side switch 72 of the inverter circuit 614b are turned on, the signal PI_CLKB (i.e., the signal obtained by merging the output signal from the inverter circuit 614a and the output signal from the inverter circuit 614b) is at a low level.

When the clock INB is switched to the low level at time t1, the first NMOS transistor of the inverter circuit 614a and the second NMOS transistor of the inverter circuit 614b are turned off. That is, the N-side switch 72 of the inverter circuit 614a and the N-side switch 74 of the inverter circuit 614b are turned off. Further, the second PMOS transistor provided in each of the four P-side switches 71_β of the inverter circuit 614a is turned on.

Here, when a low-level signal ("0") is input into the gate, the first PMOS transistor provided in each of the four P-side switches 71_β of the inverter circuit 614a is turned on. Therefore, in the code signal DN_FD, the first PMOS transistor is turned on by the same number of bits as the number of bits whose value is "0." For example, when the value of the code signal DN_FD is "0111," since "1" is input into the input terminals FI_T1, FI_T2, and FI_T3, the first PMOS transistor to which these terminals are connected to the gate is turned off. Meanwhile, since "0" is input into the input terminal FI_T4, the first PMOS transistor to which this terminal is connected to the gate is turned on.

Therefore, at time t1, of the four P-side switches 71 the same number of switches as the number of bits whose value in the code signal DN_FD is "0" are turned on, and the level of the signal output to the output terminal CKOUT_T of the inverter circuit 614a increases according to the number of switches turned on. That is, as the number of P-side switches 71_β turned on increases, the slope of the rise of the signal output to the output terminal CKOUT_T of the inverter circuit 614a becomes larger.

When the clock INB1 is switched to the low level at time t2 after the lapse of Tw time from time t1, the second NMOS transistor of the inverter circuit 614a and the first NMOS transistor of the inverter circuit 614b are turned off. Further, the second PMOS transistor provided in each of the four P-side switches 73_β of the inverter circuit 614b is turned on.

When a low-level signal ("0") is input into the gate, the first MOS transistor provided in each of the four P-side switches 73_β of the inverter circuit 614b is turned on. Therefore, the first PMOS transistor is turned on by the same number of bits as the number of bits whose value is "0" in the code signal DN_FDB. For example, when the code signal DN_FDB is "1000," since "1" input into the input terminal FI_B1, the first PMOS transistor to which this terminal is connected to the gate is turned on. Meanwhile, since "0" is input into the input terminals FI_B2, FI_B3, and FU_B4, the first PMOS transistor to which these terminals are connected to the gate is turned off.

Therefore, at time t2, of the four P-side switches 73_β, the same number of switches as the number of bits whose value in the code signal DN_FDB is "0" are turned on, and the level of the signal output to the output terminal CKOUT_B of the inverter circuit 614b increases according to the number of switches turned on. That is, as the number of P-side switches 73_β turned on increases, the slope of the rise of the signal output to the output terminal CKOUT_B of the inverter circuit 614b increases.

That is, the signal PI_CLKB in which the output signal from the inverter circuit 614a and the output signal from the inverter circuit 614b are merged has a different rising time depending on the values of the code signals DN_FD and DN_FDB.

The clock INB is switched to a high level at time t3. Here, the period from time t2 to time t3 is equal to the high-level period CINH of the input clock IN. Subsequently, the clock INB1 is switched to the high level at time t4 after the lapse of the Tw time from time t3. When both the clocks INB and INB1 are switched to the high level, the N-side switch 72 of the inverter circuit 614a and the N-side switch 74 of the inverter circuit 614b are turned on, and the signal PI_CLKB is switched to the low level.

The clock FOUTB_EVN illustrated in FIG. 20 is a signal in which the signal PI_CLKB is logically inverted via an inverter, and is a signal output from the fine delay circuit 611e.

Here, a relationship between the code signals DN_FD and DN_FDB and the delay time of the clock FOUTB_EVN in the fine delay circuit 611e is arranged. First, when the value of the code signal DN_FB is "0000" (the value of the code signal DN_FBD is "1111"), the four P-side switches 71 of the inverter circuit 614a are turned on, and the zero P-side switch 73 of the inverter circuit 614b is turned on. Therefore, the delay amount of the fall of the clock FOUTB_EVN is a value that reflects 100% of the delay amount of the clock INB in the inverter circuit 614a. Therefore, the delay time of the fall of the clock FOUTB_EVN with respect to the fall of the clock INB is the minimum delay time Tf.

When the value of the code signal DN_FB is "0001" (the value of the code signal DN_FBD is "1110"), the three P-side switches 71 of the inverter circuit 614a are turned on, and the one P-side switch 73 of the inverter circuit 614b is turned on. Therefore, the delay amount of the fall of the clock FOUTB_EVN is a value that is obtained by adding 75% of the delay amount of the clock INB when all the P-side switches 71 of the inverter circuit 614a are turned on and all the P-side switches 73 of the inverter circuit 614b are turned on, and 25% of the delay amount of the clock INB1 when all the P-side switches 73 of the inverter circuit 614b are turned on. Therefore, the delay time of the fall of the clock FOUTB_EVN with respect to the fall of the clock INB is 0.75 Tf+0.25(Tw+Tf)=Tf+0.25 Tw.

When the value of the code signal DN_FB is "0011" (the value of the code signal DN_FBD is "1100"), the two P-side switches 71 of the inverter circuit 614a are turned on, and the two P-side switches 73 of the inverter circuit 614b are turned on. Therefore, the delay amount of the fall of the clock FOUTB_EVN is a value that is obtained by adding 50% of the delay amount of the clock INB when all the P-side switches 71 of the inverter circuit 614a are turned on, and 50% of the delay amount of the clock INB1 when all the P-side switches 73 of the inverter circuit 614b are turned on. Therefore, the delay time of the fall of the clock FOUTB_EVN with respect to the fall of the clock INB is 0.50 Tf+0.50(Tw+Tf)=Tf+0.50 Tw.

When the value of the code signal DN_FB is "0111" (the value of the code signal DN_FBD is "1000"), the one P-side switch 71 of the inverter circuit 614a is turned on, and the three P-side switches 73 of the inverter circuit 614b are turned on. Therefore, the delay amount of the fall of the clock FOUTB_EVN is a value that is obtained by adding 25% of the delay amount of the clock INB when all the P-side switches 71 of the inverter circuit 614a are turned on, and 75% of the delay amount of the clock INB1 when all the P-side switches 73 of the inverter circuit 614b are turned on. Therefore, the delay time of the fall of the clock FOUTB_EVN with respect to the fall of the clock INB is 0.25 Tf+0.75(Tw+Tf)=Tf+0.75 Tw.

When the value of the code signal DN_FB is "1111" (the value of the code signal DN_FBD is "0000"), the zero P-side switch 71 of the inverter circuit 614a is turned on, and the four P-side switches 73 of the inverter circuit 614b are turned on. Therefore, the delay amount of the fall of the clock FOUTB_EVN is a value that reflects 100% of the delay amount of the clock INB1 in the inverter circuit 614b. Therefore, the delay time of the rise of the clock FOUTB_EVN with respect to the fall of the clock INB is Tf+1.00 Tw.

The rise of the clock FOUTB_EVN output from the fine delay circuit 611e has the timing when both the clock INB and the clock INB1 are set to a high level regardless of the values of the code signals DN_FB and DN_FDB. That is, since the rise of the clock FOUTB_EVN has the same timing as the rise of the clock INB1, the delay time with respect to the rise of the clock INB is Tw.

In this way, the fine delay circuit 611e receives the clock IN, and generates and outputs the clock FOUTB_EVN whose delay time of the fall differs depending on the value of the code signal DN_FD.

Next, the operation in the fine delay circuit 611o will be described. In the fine delay circuit 611o, a signal in which the logic of the input clock IN is inverted (a clock INB) is input into the input terminal CKIN_B, and a signal in which the clock INB is delayed by 1.0 Tw in time (a clock INB1) is input into the input terminal CKIN_A. That is, the signal input into the input terminal CKIN_A in the fine delay circuit 611e (the clock INB) is input into the input terminal CKIN_B in the fine delay circuit 611o, and the signal input into the input terminal CKIN_B in the fine delay circuit 611e (the clock INB1) is input into the input terminal CKIN_A in the fine delay circuit 611o. Therefore, a relationship between the code signals DN_FD and DN_FDB and the delay time of the clock FOUTB_ODD generated in the fine delay circuit 611o is as follows.

First, when the value of the code signal DN_FB is "0000" (the value of the code signal DN_FBD is "1111"), the four P-side switches 71 of the inverter circuit 614a are turned on, and the zero P-side switch 73 of the inverter circuit 614b is turned on. Therefore, the delay amount of the fall of the clock FOUTB_ODD is a value that reflects 100% of the delay amount of the clock INB1 in the inverter circuit 614a. Therefore, the delay time of the fall of the clock FOUTB_ODD with respect to the fall of the clock INB is Tf+1.00 Tw.

When the value of the code signal DN_FB is "0001" (the value of the code signal DN_FBD is "1110"), the three P-side switches 71 of the inverter circuit 614a are turned on, and the one P-side switch 73 of the inverter circuit 614b is turned on. Therefore, the delay amount of the fall of the clock FOUTB_ODD is a value that is obtained by adding 75% of the delay amount of the clock INB1 when all the P-side switches 71 of the inverter circuit 614a are turned on, and 25% of the delay amount of the clock INB when all the P-side switches 73 of the inverter circuit 614b are turned on. Therefore, the delay time of the fall of the clock FOUTB_ODD with respect to the fall of the clock INB is 0.75 (Tw+Tf)+0.25 Tf=Tf+0.75 Tw.

When the value of the code signal DN_FB is "0011" (the value of the code signal DN_FBD is "1100"), the two P-side switches 71 of the inverter circuit 614a are turned on, and the two P-side switches 73 of the inverter circuit 614b are turned on. Therefore, the delay amount of the fall of the clock FOUTB_ODD is a value that is obtained by adding 50% of the delay amount of the clock INB1 when all the P-side switches 71 of the inverter circuit 614a are turned on, and 50% of the delay amount of the clock INB when all the P-side switches 73 of the inverter circuit 614b are turned on. Therefore, the delay time of the fall of the clock FOUTB_ODD with respect to the rise of the clock INB is 0.50 (Tw+Tf)+0.50 Tf=Tf+0.50 Tw.

When the value of the code signal DN_FB is "0111" (the value of the code signal DN_FBD is "1000"), the one P-side switch 71 of the inverter circuit 614a is turned on, and the three P-side switches 73 of the inverter circuit 614b are turned on. Therefore, the delay amount of the fall of the clock FOUTB_ODD is a value that is obtained by adding 25% of the delay amount of the clock INB1 when all the P-side switches 71 of the inverter circuit 614a are turned on, and 75% of the delay amount of the clock INB when all the P-side switches 73 of the inverter circuit 614b are turned on. Therefore, the delay time of the rise of the clock FOUTB_ODD with respect to the fall of the clock INB is 0.25 (Tw+Tf)+0.75 Tf=Tf+0.25 Tw.

When the value of the code signal DN_FB is "1111" (the value of the code signal DN_FBD is "0000"), the zero P-side switches 71 of the inverter circuit 614a are turned on, and the four P-side switches 73 of the inverter circuit 614b are turned on. Therefore, the delay amount of the fall of the clock FOUTB_ODD is a value that reflects 100% of the delay amount of the clock INB in the inverter circuit 614b. Therefore, the delay time of the fall of the clock FOUTB_EVN with respect to the fall of the clock INB is Tf.

The rise of the clock FOUTB_ODD output from the fine delay circuit 611o has the timing when both the clock INB and the clock INB1 are set to a high level regardless of the values of the code signals DN_FB and DN_FDB. That is, since the rise of the clock FOUTB_EVN has the same timing as the rise of the clock INB1, the delay time with respect to the rise of the clock INB is Tw.

FIG. 21 illustrates the relationship between the code signals DN_FB and DN_FDB and the delay times of the clock FOUTB_EVN and the clock FOUTB_ODD. That is, when the value of the code signal DN_FB is "0000," the delay time of the fall of the clock FOUTB_EVN is Tf, and the delay time of the fall of the clock FOUTB_ODD is Tf+1.00 Tw. When the value of the code signal DN_FB is "0001," the delay time of the fall of the clock FOUTB_EVN is Tf+0.25 Tw, and the delay time of the fall of the clock FOUTB_ODD is Tf+0.75 Tw. When the value of the code signal DN_FB is "0011," the delay time of the fall of the clock FOUTB_EVN is Tf+0.50 Tw, and the delay time of the fall of the clock FOUTB_ODD is Tf+0.50 Tw. When the value of the code signal DN_FB is "0111," the delay time of the fall of the clock FOUTB_EVN is Tf+0.74 Tw, and the delay time of the fall of the clock FOUTB_ODD is Tf+0.25 Tw. When the value of the code signal DN_FB is "1111," the delay time of the fall of the clock FOUTB_EVN is Tf+1.00 Tw, and the delay time of the fall of the clock FOUTB_ODD is Tf.

In this way, the clock FOUTB_EVN and the clock FOUTB_ODD are complementary and are generated so that the sum of the delay times is constant (1.00 Tw) regardless of the value of the input code signal DN_FB. Further, the phrase "sum of the delay times" indicates the sum of delay times excluding the maximum delay time Tf. That is, when the delay time of the fall of the clock FOUTB_EVN is lengthened, the delay time of FOUTB_ODD is shortened. In contrast, when the delay time of the fall of the clock FOUTB_EVN is shortened, the delay time of FOUTB_ODD is lengthened.

Figure 22:
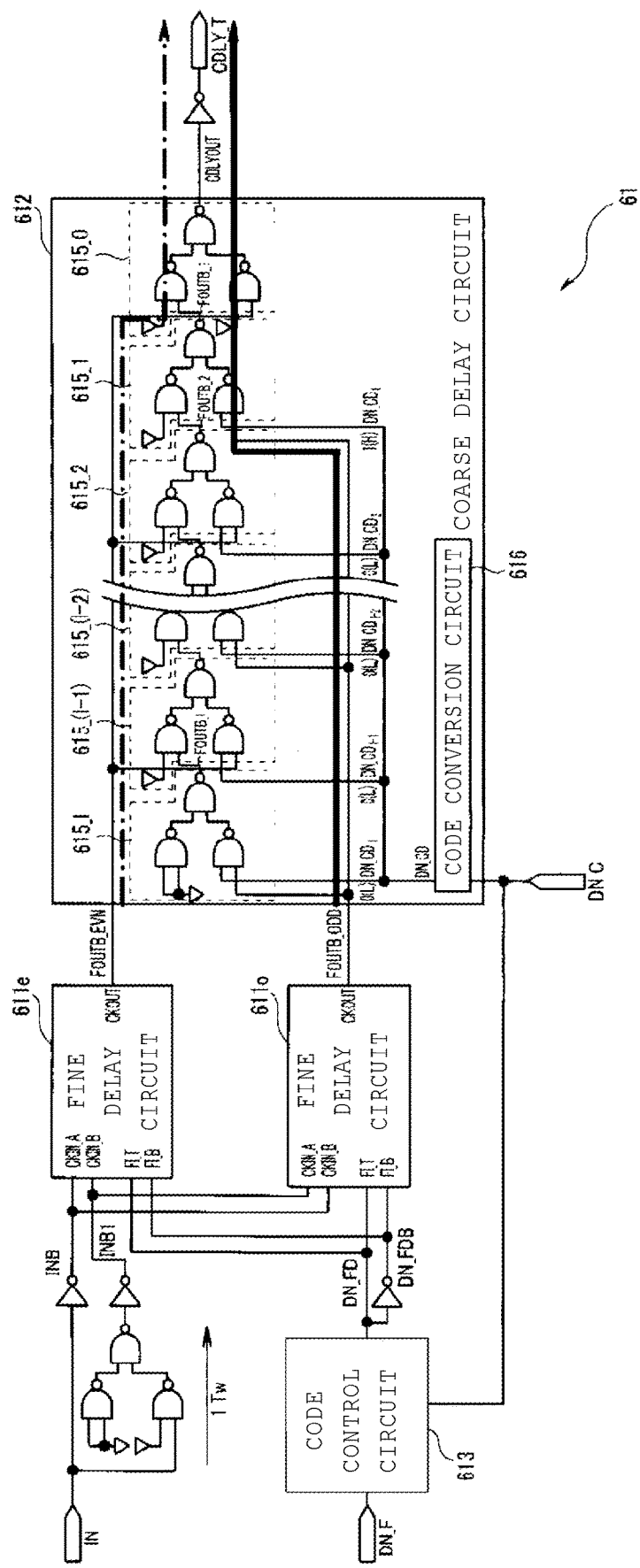
FIG. 22 is a diagram illustrating an example of a state during the operation of a coarse delay circuit.
Figure 23:
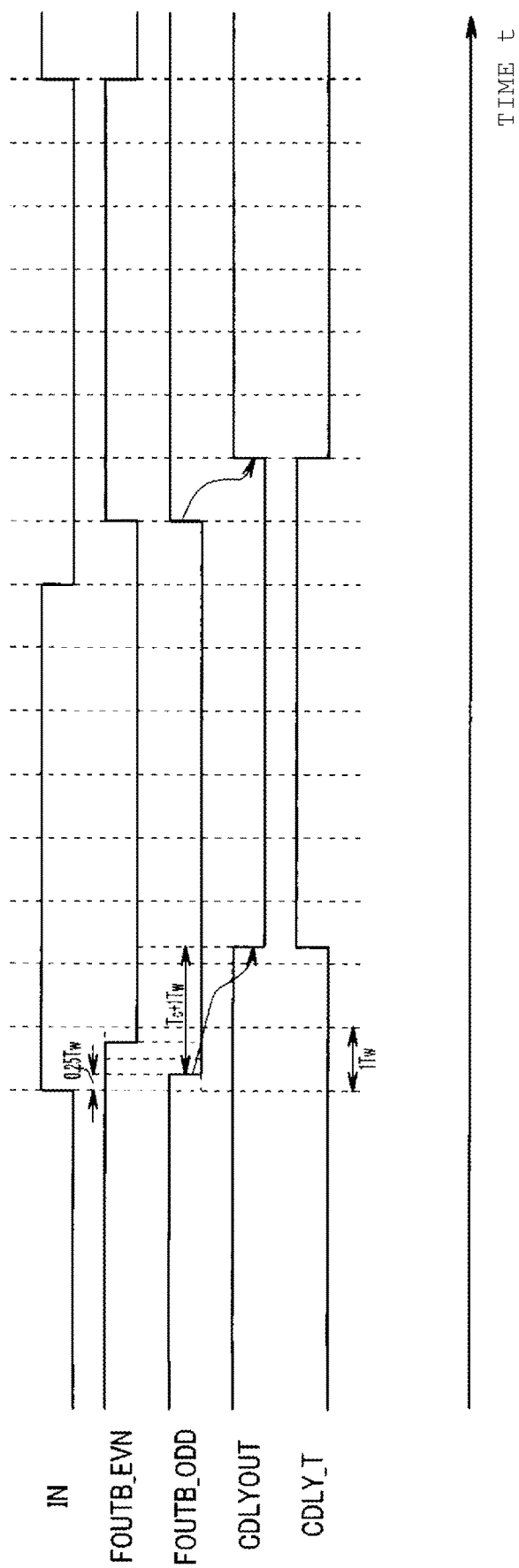
FIG. 23 is a timing chart illustrating the operation of the coarse delay circuit in the state of FIG. 22.

Next, the operation in the coarse delay circuit 612 will be described. FIG. 22 illustrates an example of a state during the operation of the coarse delay circuit. Further, FIG. 23 is a timing chart illustrating the operation of the coarse delay circuit in the state of FIG. 22. In the example illustrated in FIG. 22, the high-level period of the input clock IN is longer than the low-level period by 2.50 Tw. In the example of FIG. 22, $\Delta$ is 1.25 Tw. Therefore, the code signal DN_C has a value of "001." As a result, the code conversion circuit 616 outputs "0000001" as the code signal DN_CD. That is, only the code signal DN_CD1 is a high-level signal, and the code signals DN_CD2 to DN_CD1 are low-level signals. As a result, the fall of the clock FOUTB_ODD output from the fine delay circuit 611o is delayed by the delay elements 615_1 and 615_0. Therefore, the fall of the output clock CDLYOUT is delayed by 1 Tw in addition to the minimum delay time Tc in the coarse delay circuit 612 (i.e., the delay time of the delay element 615_0) with respect to the fall of the clock FOUTB_ODD (see, e.g., the path indicated by the thick line in FIG. 23).

Meanwhile, the rise of the output clock CDLYOUT does not depend on the code signal DN_C, but the rise of the clock FOUTB_EVN output from the fine delay circuit 611e is delayed by the delay element 615_0. Therefore, the rise of the output clock CDLYOUT is delayed by the minimum delay time Tc in the coarse delay circuit 612 with respect to the rise of the clock FOUTB_EVN (see, e.g., the path indicated by the thick dashed line in FIG. 23).

When $\Delta$ is 1.25 Tw, the code signal DN_F has a value of "001." Since the code signal DN_C is "001," that is, an odd number, the code control circuit 613 converts the code signal DN_F and outputs "0111" as the code signal DN_FD. When the value of the code signal DN_FB is "0111," the signal output from the fine delay circuit 611o is a signal in which the clock IN is delayed by 0.25 Tw in addition to the minimum delay time Tf in the fine delay circuit 611. Further, when the value of the code signal DN_FB is "0111," the signal output from the fine delay circuit 611e is a signal in which the clock IN is delayed by 0.75 Tw in addition to the minimum delay time Tf in the fine delay circuit 611.

From the above, the fall of the output clock CDLYOUT is a signal in which the clock IN is delayed by 1.25 Tw in addition to the minimum delay time (Tf+Tc). Further, the rise of the output clock CDLYOUT is a signal whose input clock is delayed by Tw+Tc. In FIG. 23, the waveform of each signal is illustrated by taking the minimum delay time Tf in the fine delay circuit 611 as 0 Tw, and the minimum delay time Tc in the coarse delay circuit 612 as 1 Tw.

Figure 24:
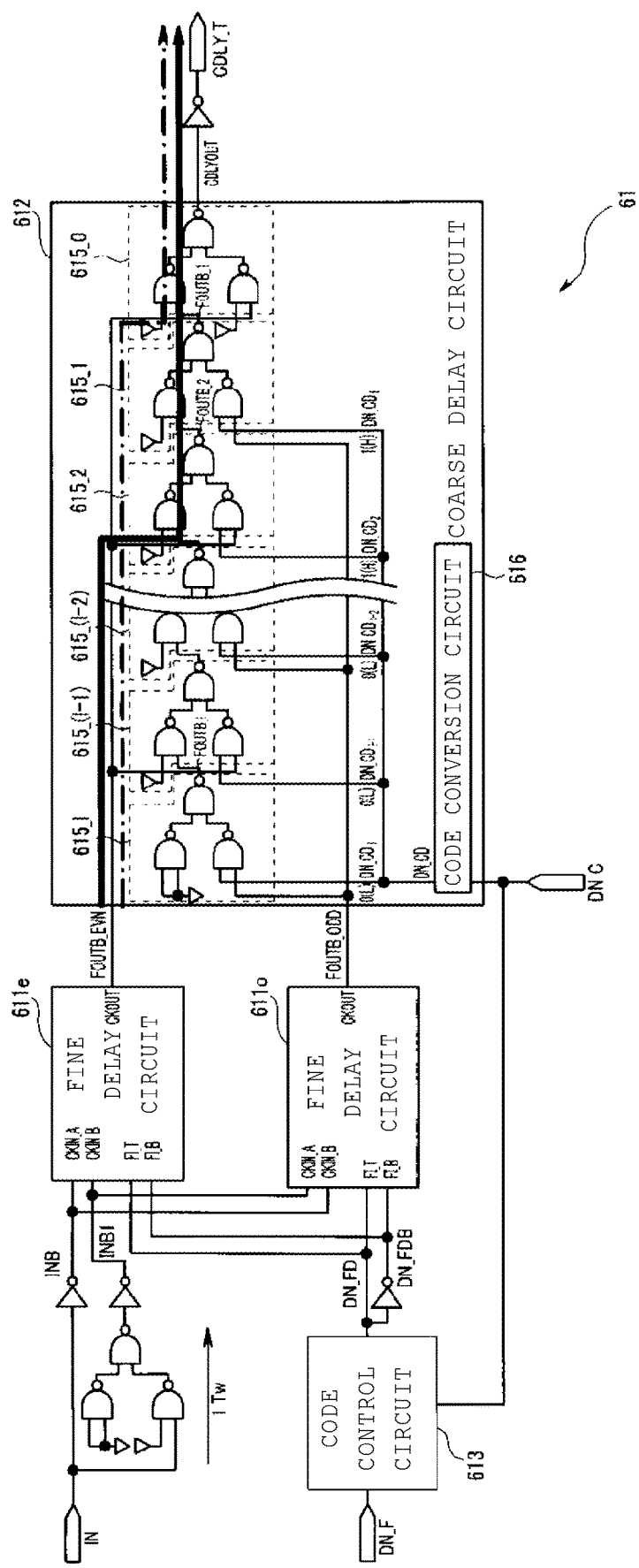
FIG. 24 is a diagram illustrating an example of a state during the operation of a coarse delay circuit.
Figure 25:
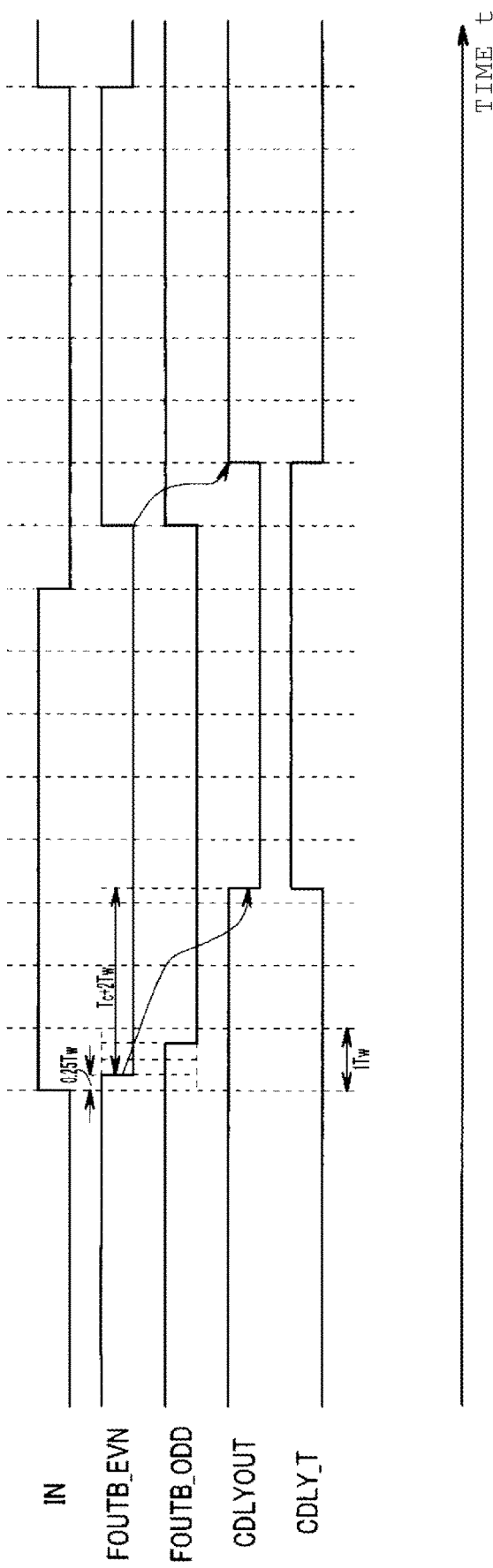
FIG. 25 is a timing chart illustrating the operation of the coarse delay circuit in the state of FIG. 24.

Next, the operation in the coarse delay circuit 612 will be described with reference to another specific example. FIG. 24 illustrates an example of a state during the operation of the coarse delay circuit. Further, FIG. 25 is a timing chart illustrating the operation of the coarse delay circuit in the state of FIG. 24. In the example illustrated in FIG. 24, the high-level period of the input clock IN is longer than the low-level period by 4.50 Tw. In the example of FIG. 24, $\Delta$ is 2.25 Tw. Therefore, the code signal DN_C has a value of "010." As a result, the code conversion circuit 616 outputs "0000011" as the code signal DN_CD. That is, the code signals DN_CD1 and 2 are high-level signals, and the code signals DN_CD3 to DN_CD1 are low-level signals. As a result, the fall of the clock FOUTB_EVN output from the fine delay circuit 611e is delayed by the delay elements 615_2 to 615_0. Therefore, the fall of the output clock CDLYOUT is delayed by 2 Tw in addition to the minimum delay time Tc in the coarse delay circuit 612 with respect to the fall of the clock FOUTB_EVN (see, e.g., the path indicated by the thick line path in FIG. 24).

Meanwhile, the rise of the output clock CDLYOUT does not depend on the code signal DN_C, but the rise of the clock FOUTB_EVN output from the fine delay circuit 611e is delayed by the delay element 615_0. Therefore, the rise of the output clock CDLYOUT is delayed by the minimum delay time Tc in the coarse delay circuit 612 with respect to the rise of the clock FOUTB_EVN (see, e.g., the path indicated by the thick dashed line in FIG. 24).

When $\Delta$ is 2.25 Tw, the code signal DN_F has a value of "010." Since the code signal DN_C is "010," that is, an even number, the code control circuit 613 converts the code signal DN_F and outputs "0001" as the code signal DN_FD. When the value of the code signal DN_FB is "0001," the signal output from the fine delay circuit 611e is a signal in which the clock IN is delayed by 0.25 Tw in addition to the minimum delay time Tf in the fine delay circuit 611. Further, when the value of the code signal DN_FB is "0001," the signal output from the fine delay circuit 611e is a signal in which the clock IN is delayed by 0.75 Tw in addition to the minimum delay time Tf in the fine delay circuit 611.

From the above, the rise of the output clock CDLYOUT is a signal in which the clock IN is delayed by 2.25 Tw in addition to the minimum delay time (Tf+Tc). Further, the fall of the output clock CDLYOUT is a signal in which the input clock is delayed by Tw+Tc. In FIG. 25, the waveform of each signal is illustrated by taking the minimum delay time Tf in the fine delay circuit 611 as 0 Tw, and the minimum delay time Tc in the coarse delay circuit 612 as 1 Tw.

The output clock CDLYOUT output from the coarse delay circuit 612 is logically inverted by the inverter and output from the delay block circuit 61 as the clock CDLY_T.

The delay block circuit 62 receives the input clock /IN and the code signals UP_F and UP_C constituting the signal DCA_CODE, and generates the delay clock CDLY_B. The operation of each component of the delay block circuit 62 is the same as that of the delay block circuit 61. That is, in the above description, by replacing the code signals DC_F, DN_C, DN_FD, and DN_CD with the code signals UP_F, UP_C, UP_FD, and UP_CD, respectively, the delay block circuit 62 generates and outputs the clock CDLY_B from the input clock /IN.

(2-1-4. Operation of Waveform Generation Circuit)

Figure 26:
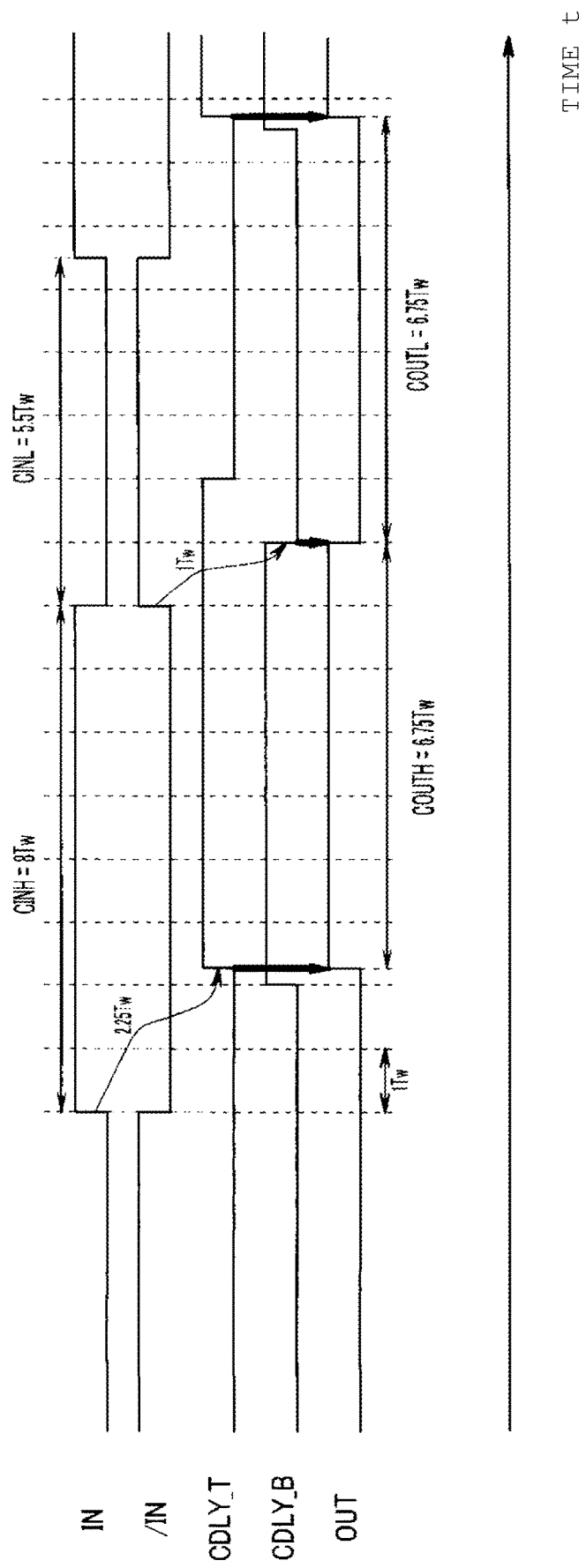
FIG. 26 is a timing chart illustrating an example of the operation in a waveform generation circuit.

Upon receiving the two clocks output from the DCA circuit (the clocks CDLY_T and CDLY_B), the waveform generation circuit 44 generates an output clock OUT. FIG. 26 is a timing chart illustrating an example of the operation in the waveform generation circuit. FIG. 26 is a timing chart when the high-level period CINH of the clock IN is 8 Tw and the low-level period CINL thereof is 5.5 Tw. Further, in FIG. 26, the minimum delay time Tf in the fine delay circuit 611 is 0 Tw, and the minimum delay time Tc in the coarse delay circuit 612 is 1 Tw.

In this case, the clock CDLY_T output from the DCA circuit 43 is generated by delaying the rise and fall of the clock IN by a predetermined amount by the delay block 61. Specifically, since $\Delta=(8-5.5)/2=1.25$ Tw, the rise of the clock CDLY_T is delayed by 2.25 Tw (=Tf+Tc+1.25 Tw) with respect to the rise of the clock IN, and the fall of the clock CDLY_D is delayed by 2 Tw with respect to the fall of the clock IN.

Further, the clock CDLY_B is generated by delaying the rise and fall of the clock /IN by a predetermined amount by the delay block 62. Specifically, the rise of the clock CDLY_B is delayed by 1 Tw (=Tf+Tc) with respect to the rise of the clock /IN, and the fall of the clock CDLY_D is delayed by 2 Tw with respect to the fall of the clock IN.

The waveform generation circuit 44 generates a signal that rises at the timing when the clock CDLY_T rises and falls at the timing when the clock CDLY_D rises, as an output clock OUT. That is, the output clock OUT is a signal that rises after 2.25 Tw elapses from the rise of the clock IN and falls after 1 Tw elapses from the rise of the clock /IN. The high-level period COUTH of the clock OUT generated in this way is 6.75 Tw, and the low-level period COUTL thereof is also 6.75 Tw. That is, the output clock OUT has a duty cycle of 50%. The waveform generation circuit 44 also generates a signal /OUT in which the output clock OUT is logically inverted, and outputs the signal /OUT together with the output clock OUT.

(3. Effect)

According to the present embodiment, even when the delay amount is changed during operation, the DCA circuit 43 may output highly accurate clocks CDLY_T and CDLY_B based on the change.

Figures 27, 28:
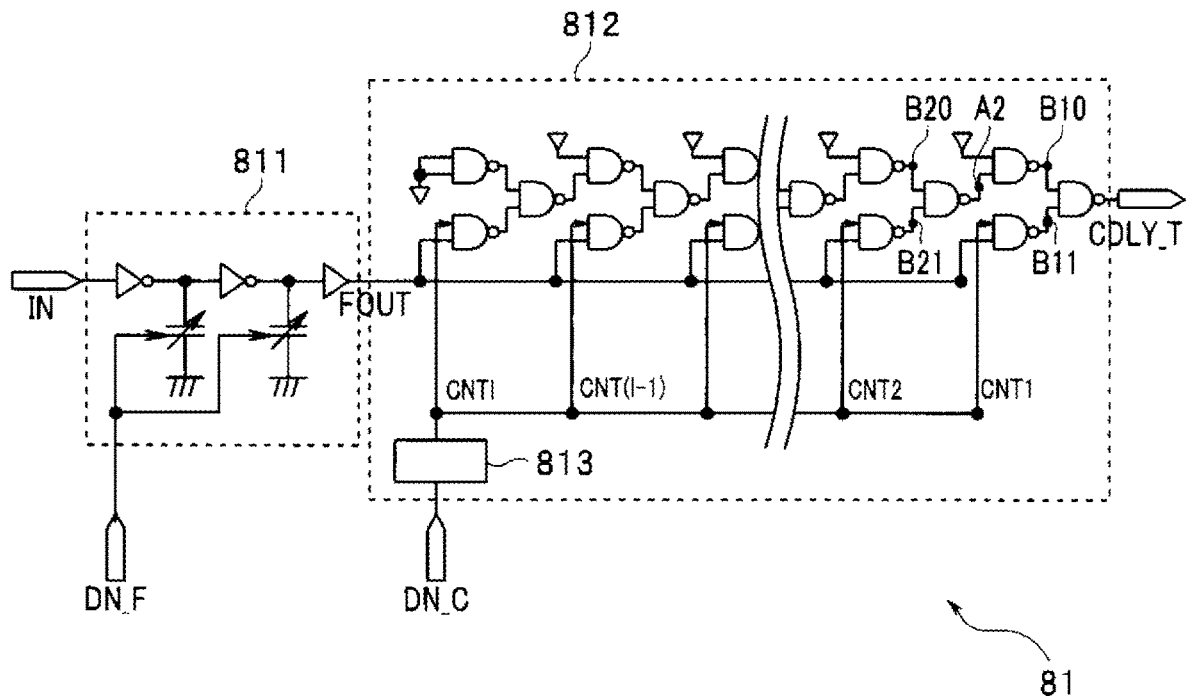
FIG. 27 is a block diagram illustrating a configuration of a delay block circuit of a comparative example.
FIG. 28 is a diagram illustrating an example of the value of a signal CNT.

FIG. 27 is a block diagram illustrating a configuration of a delay block circuit of a comparative example. The delay block circuit 81 of the comparative example includes the fine delay circuit 811 and the coarse delay circuit 812. The delay block circuit 81 is a delay circuit that corrects the rising timing of the input clock IN, and receives the input clock IN and the code signals DN_F and DN_C constituting the signal DCA_CODE to generate the delay clock CDLY_T.

The fine delay circuit 811 generates a signal in which the rise of the clock IN is delayed based on the input code signal DN_F, and outputs the signal that is logically inverted by the inverter as the signal FOUT. The fine delay circuit 811 is configured, for example, as follows. Three inverters are connected in series between the input terminal into which the clock IN is input and the output terminal from which the signal FOUT is output. A first variable resistor is connected between the output terminal of the inverter closest to the input terminal and the ground potential Vss. Further, a second variable resistor is connected between the output terminal of the inverter provided in the center and the ground potential V. By adjusting the resistance value of the first variable resistor and the resistance value of the second variable resistor according to the code signal DN_F, a signal FOUT in which the rise of the clock IN is delayed by a desired amount is generated.

The coarse delay circuit 812 generates a signal whose rise of the signal FOUT is delayed based on the input code signal DN_C, and outputs the signal as an output clock CDLY_T. The coarse delay circuit 812 includes 1 delay elements. Each delay element includes, for example, three NAND gates.

The first NAND gate of the delay element receives the clock FOUT at one input. Further, the first NAND gate receives the code signal CNTγ (the value of the γth bit of the code signal CNT) at the other input. The second NAND gate of the delay element receives the signal A(γ+1) output from the delay element of the previous stage at one input. The second NAND gate is also connected to a node having a power potential Vcc at the other input. However, the second NAND gate of the delay element at the first stage is grounded at the two inputs, that is, connected to a node having a ground potential Vss. The third NAND gate of the delay element receives the output of the first NAND gate and the output of the second NAND gate, and outputs a signal Aγ. Each of the delay elements causes a delay equal to 1.0 Tw in time.

Further, the coarse delay circuit 812 includes a code conversion circuit 813. The code conversion circuit 813 receives the code signal DN_C, decodes the code signal DN_C, and generates a signal CNT. Specifically, the code conversion circuit 813 raises one bit of the signal CNT to a high level during a certain period. For example, when the binary code "100" indicating the decimal number "4" is received as the code signal DN_C, the code conversion circuit 616 generates a signal in which the fourth bit is "1 (high level)" and the other bits are "0 (low level)" as the signal CNT, that is, "0001000." FIG. 28 is a diagram illustrating an example of the value of the signal CNT. Further, FIG. 28 relates to an exemplary case where the coarse delay circuit 812 contains seven delay elements.

In the delay block circuit 81 of the comparative example and the delay block circuit 61 of the embodiment configured in this way, descriptions will be made on the operation when the delay amount is changed during the operation and the code signal DN_C is changed. Here, a case where the code signal DN_C is changed from "001" to "010" will be described as an example.

Figure 29:
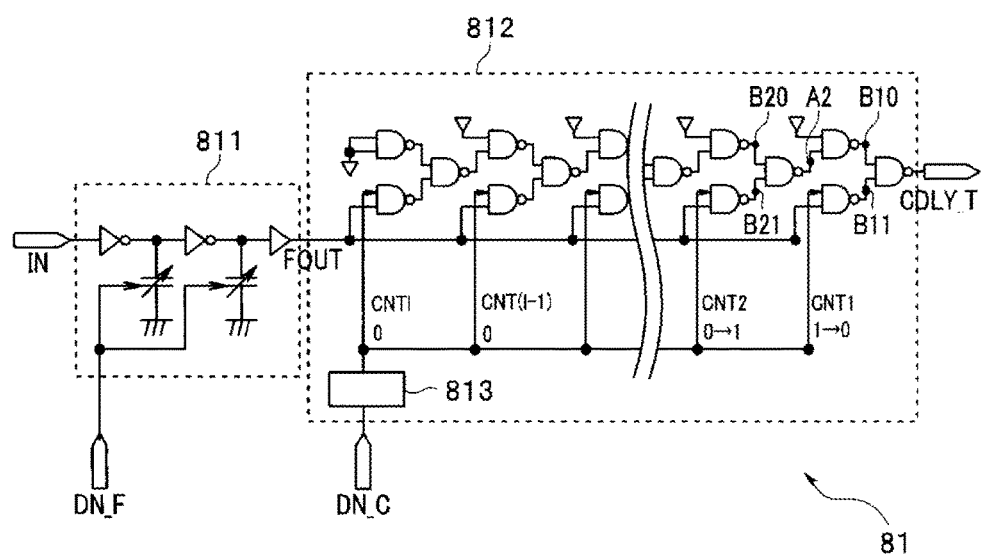
FIG. 29 is a diagram illustrating an example of a state during the operation of the coarse delay circuit of the comparative example.
Figure 30:
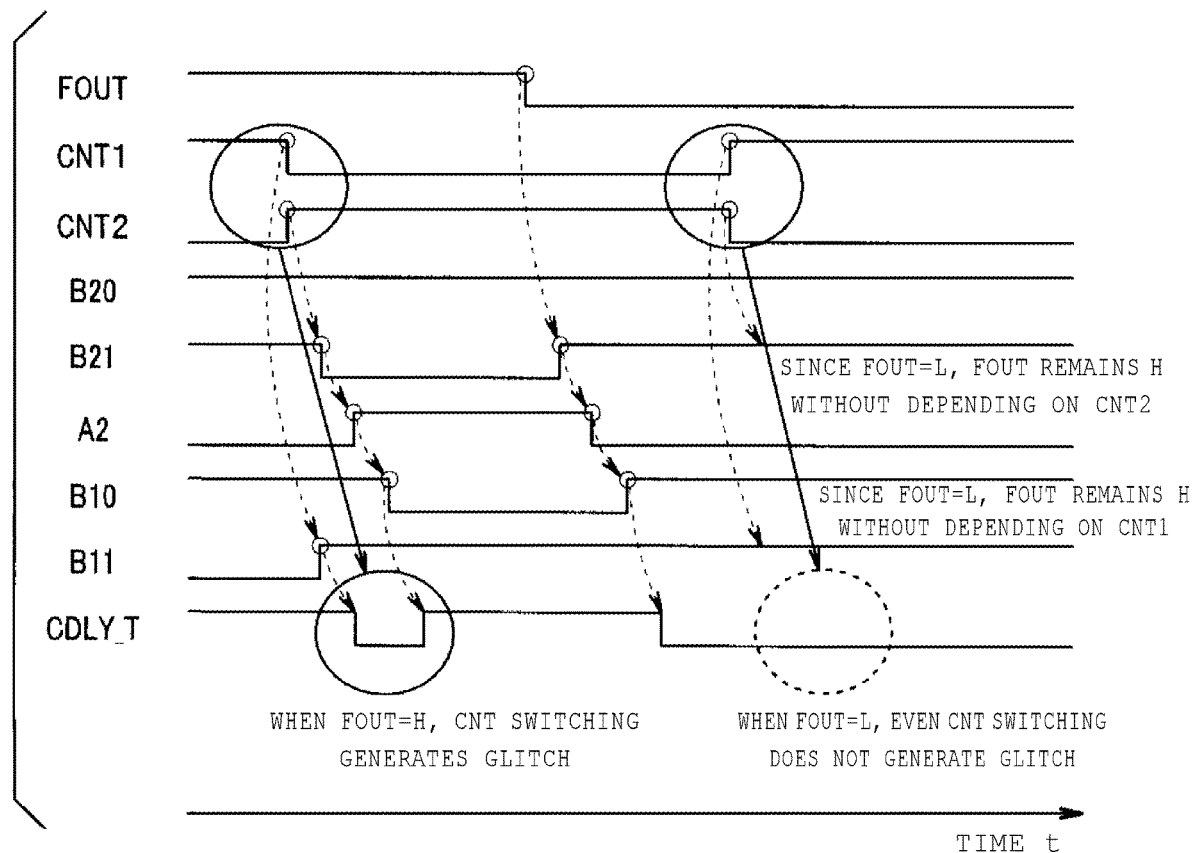
FIG. 30 is a timing chart illustrating the operation of the coarse delay circuit of the comparative example in the state of FIG. 29.

FIG. 29 is a diagram illustrating an example of a state during the operation of the coarse delay circuit of the comparative example. Further, FIG. 30 is a timing chart illustrating the operation of the coarse delay circuit of the comparative example in the state of FIG. 29. When the code signal DN_C is "001," the value of the signal CNT is set to "0000001" by the code conversion circuit 813. That is, "1" is set in the first bit (CNT1), and "0" is set in the other bits. When the code signal DN_C is changed to "010" at a certain timing during the high level of the clock FOUT input into the coarse delay circuit 812, the value of the signal CNT is changed to "000010" by the code conversion circuit 813. That is, the first bit (CNT1) is changed from "1" to "0," and the second bit (CNT2) is changed from "0" to "1." The other bits remain "0."

When the signal CNT1 is changed from "1" to "0," the output signal B11 of the first NAND of the delay element of the last stage into which the signal CNT1 is input is switched from the low level to the high level. Meanwhile, when the signal CNT2 is changed from "0" to "1" at the same timing, the output signal B21 of the first NAND of the delay element at the second stage from the back where the signal CNT2 is input is switched from the high level to the low level. Since the output signal B20 of the second NAND of the delay element at the second stage from the back is at the high level, the output signal A2 of the third NAND at the second stage from the back is switched from the low level to the high level. When the output signal A2 is switched to the high level, the output signal B10 of the second NAND of the delay element at the last stage is switched from the high level to the low level.

Here, the delay time from the fall of the signal CNT1 to the rise of the output signal B11 is the delay time of a single NAND. In contrast, the delay time from the rise of the signal CNT2 to the fall of the output signal B10 is the delay time of three NANDs. Therefore, during the period from the rise of the signal B11 to the fall of the signal B10 (i.e., the period corresponding to the delay time of two NANDs), the signal output from the third NAND at the last stage is at the low level. As described above, in the coarse delay circuit 812 of the comparative example, when the code signal DN_C is changed during the period when the clock FOUT is at a high level, a period at which the output clock CDLY_T goes to the low level (glitch) occurs due to the time difference in signal transmission.

When the code signal DN_C is changed at a certain timing during the period when the clock FOUT is at a low level, since the signal B21 and the signal B10 remain at the high level, the output clock CDLY_T does not glitch. Therefore, in the coarse delay circuit 81 of the comparative example, it is necessary to change the delay amount during the low-level period of the clock FOUT, but as the clock cycle becomes shorter with the recent increase in speed, it is difficult to pinpoint the delay amount during the low-level period.

Figure 31:
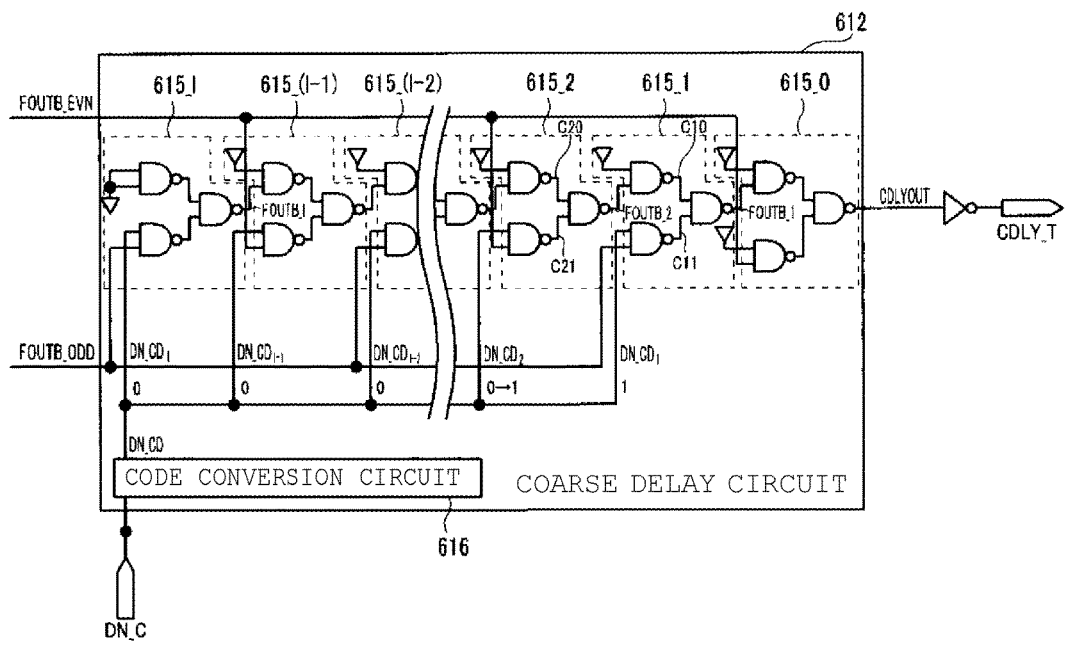
FIG. 31 is a diagram illustrating an example of a state during the operation of the coarse delay circuit according to the embodiment.
Figure 32:
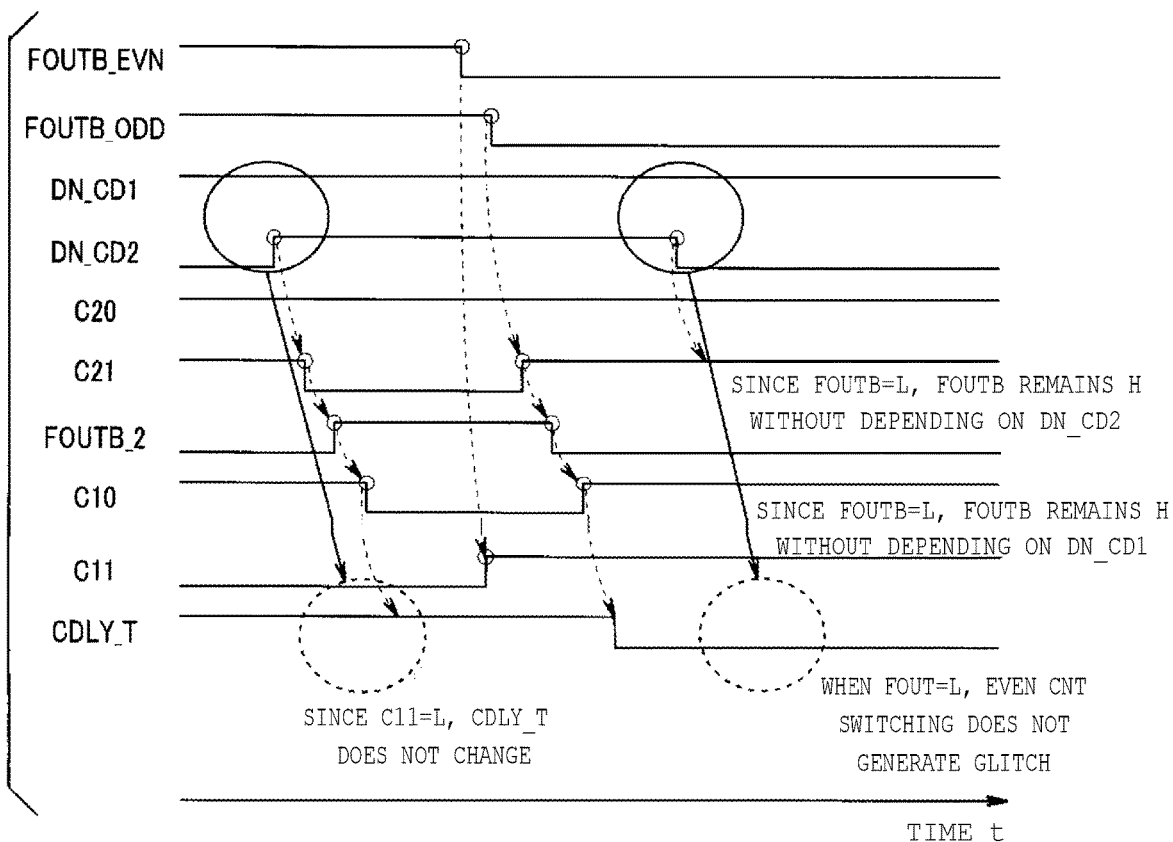
FIG. 32 is a timing chart illustrating the operation of the coarse delay circuit of the embodiment in the state of FIG. 31.

The operation of the coarse delay circuit 612 of the present embodiment is as follows. FIG. 31 is a diagram illustrating an example of a state during the operation of the coarse delay circuit of the embodiment. Further, FIG. 32 is a timing chart illustrating the operation of the coarse delay circuit of the embodiment in the state of FIG. 31.

When the code signal DN_C is "001," the value of the code signal DN_CD is set to "0000001" by the code conversion circuit 616. That is, "1" is set in the first bit (the code signal DN_CD1), and "0" is set in the other bits. When the code signal DN_C is changed to "010" at a certain timing during the period when the clock FOUT input into the coarse delay circuit 612 is at a high level, the value of the code signal DN_CD is changed to "000011" by the code conversion circuit 613. That is, the second bit (the code signal DN_CD2) is changed from "0" to "1." The other bits remain the same.

That is, in the coarse delay circuit 612 of the embodiment, the code signal DN_CD1 is not switched from a high level to a low level when the code signal DN_CD2 is switched. Therefore, the output signal C11 of the first NAND of the delay element 615_1 into which the code signal DN_CD1 is input remains at a low level. Meanwhile, when the code signal DN_CD2 is changed from "0" to "1" at the same timing, the output signal C21 of the first NAND of the delay element 615_2 is switched from a high level to a low level. Since the output signal C20 of the second NAND of the delay element 615_2 is at a high level, the output signal FOUT_B2 of the third NAND of the delay element 615_2 is switched from a low level to a high level. When the output signal FOUT_B2 is switched to the high level, the output signal C10 of the second NAND of the delay element 615_1 is switched from a high level to a low level. At this time, since the output signal C11 of the first NAND of the delay element 615_1 is at a low level, the output signal FOUT_B1 output from the third NAND of the delay element 615_1 remains at a low level. Therefore, the output clock CDLY_T, which is the logical inversion of the output signal FOUT_B1, remains at a high level, and glitches due to delay amount switching do not occur.

As described above, according to the present embodiment, by code-converting the delay amount input into the coarse delay circuit 612 using a thermometer code, it is possible to generate a highly accurate output clock without generating glitches even with changing the delay amount during operation.

Usually, the delay amount adjustment is performed step by step. That is, adjustment is performed while increasing or decreasing the delay amount in units of the minimum delay time unit Tc. When performing step-by-step adjustments in this way, in the delay block circuit 81 of the comparative example, there is a possibility that the delay amount may not be corrected correctly due to the difference between the switching timing of the code signal DN_F input into the fine delay circuit and the switching timing of the code signal DN_C input into the coarse delay circuit.

For example, descriptions will be made on a case where the delay amount is changed from Δ=1.75 Tw to Δ=2.00 Tw. In the following, both the minimum delay time Tf in the fine delay circuit and the minimum delay time Tf in the coarse delay circuit will be described as zero.

In the case of Δ1.75 Tw, the code signal DN_F input into the fine delay circuit is "011," and the code signal DN_C input into the coarse delay circuit is "001." In the case of the delay block circuit 81 of the comparative example, the code signal DN_F outputs a signal FOUT in which the rise of the input clock is delayed by 0.75 Tw from the fine delay circuit 8. Meanwhile, in the coarse delay circuit 812, the code conversion circuit 616 converts the code signal DN_C="001" into the code signal CNT="0000001" and inputs the converted code signal into each delay element. The coarse delay circuit 812 generates and outputs a signal in which the rise of the signal FOUT received from the fine delay circuit 811 is delayed by 1 Tw by the code signal CNT="0000001."

In this state, when the delay amount is changed to Δ=2.00 Tw, the code signal DN_F input into the fine delay circuit 811 is changed to "000," and the code signal DN_C input into the coarse delay circuit 812 is changed to "010." At this time, when the operation of the code conversion circuit 813 in the coarse delay circuit 812 (the operation of changing the code signal CNT) is performed before the delay amount of the signal FOUT output from the fine delay circuit 811 is changed, the delay amount may not be corrected correctly. That is, the coarse delay circuit 812 receives the signal FOUT in which the rise of the input clock, which is the delay amount before the change, is delayed by 0.75 Tw, and the signal delayed by 2 Tw is output by the code signal CNT="000010" after the change. That is, even when the delay amount is changed from 1.75 Tw to 2.00 Tw, the delay amount of the output signal after the change is 2.75 Tw.

Further, when the delay amount of the signal FOUT output from the fine delay circuit 811 is changed before performing the operation of the code conversion circuit 813 in the coarse delay circuit 812 (the operation of changing the code signal CNT), the coarse delay circuit 812 receives the signal FOUT in which the rise of the input clock, which is the delay amount after the change, is delayed by 0.00 Tw, and the signal delayed by 1 Tw is output by the code signal CNT="0000001" before the change. That is, even when the delay amount is changed from 1.75 Tw to 2.00 Tw, the delay amount of the output signal after the change is 1.00 Tw.

In this way, in the delay block circuit 81 of the comparative example, if the correction is performed so that the code signal input into the fine delay circuit 811 and the code signal DN_C input into the coarse delay circuit 812 are both switched, when the code signal change timing is shifted, there is a possibility that the delay amount may not be corrected correctly.

In contrast, in the delay block circuit 611 of the present embodiment, the code change timing is shifted, and even when the code of the coarse delay circuit 612 is changed before the fine delay circuit 611, the deviation of the delay amount may be made smaller than that of the comparative example. In the case of Δ1.75 Tw, the code signal DN_F input into the fine delay circuit is "011," and the code signal DN_C input into the coarse delay circuit is "001." At this time, the code signal DN_FD generated by the code control circuit 613 is "0001." The code signal DN_C generated by the code conversion circuit 616 is "0000001." Therefore, the coarse delay circuit 612 generates and outputs a signal in which the rise of the signal FOUTB_ODD output from the fine delay circuit 611o is delayed by 1 Tw. The fine delay circuit 611o generates a signal in which the rise of the input clock IN is delayed by 0.75 Tw based on the input code signal DN_FD "0001," and outputs the signal as the signal FOUTB_ODD. Therefore, a signal in which the rise of the input clock IN is delayed by 1.75 Tw is output from the coarse delay circuit 612. At this time, the fine delay circuit 611e generates a signal in which the rise of the input clock IN is delayed by 0.25 Tw based on the input code signal DN_FD "0001," and outputs the signal as the signal FOUTB_EVN.

In this state, when the delay amount is changed to Δ=2.00 Tw, the code signal DN_F input into the fine delay circuit 811 is changed to "000," and the code signal DN_C input into the coarse delay circuit 812 is changed to "010." At this time, the code signal DN_FD generated by the code control circuit 613 is "0000." The code signal DN_C generated by the code conversion circuit 616 is "0000011." Therefore, the coarse delay circuit 612 generates and outputs a signal in which the rise of the signal FOUTB_EVN output from the fine delay circuit 611e is delayed by 2 Tw. The fine delay circuit 611e generates a signal in which the rise of the input clock IN is delayed by 0.00 Tw based on the input code signal DN_FD "0000," and outputs the signal as the signal FOUTB_EVN. Therefore, a signal in which the rise of the input clock IN is delayed by 2.00 Tw is output from the coarse delay circuit 612. At this time, the fine delay circuit 611o generates a signal in which the rise of the input clock IN is delayed by 1.00 Tw based on the input code signal DN_FD "0000," and outputs the signal as the signal FOUTB_EVN.

At this time, when the operation of the code conversion circuit 616 (the operation of changing the code signal CNT) in the coarse delay circuit 612 is performed before the delay amounts of the signals FOUTB_ODD and FOUTB_EVN output from the fine delay circuit 611 are changed, the signal FOUTB_EVN whose rise of the input clock IN is delayed by 0.25 Tw is output after being delayed by 2.00 Tw by the coarse delay circuit 612. That is, the deviation of the correction amount is 0.25 Tw, and the error of the correction amount may be made smaller than that of the comparative example.

Further, when the delay amounts of the signals FOUTB_ODD and FOUTB_EVN output from the fine delay circuit 611 are changed before the operation of the code conversion circuit 616 in the coarse delay circuit 612 (the operation of changing the code signal CNT) is performed, the signal FOUTB_ODD whose rise of the input clock IN is delayed by 1.00 Tw is output after being delayed by 1.00 Tw by the coarse delay circuit 612. That is, the deviation of the correction amount is 2.00 Tw, and the correction may be performed with the correct delay amount.

As described above, according to the present embodiment, when performing a correction to switch both the switching timing of the code signal DN_F input into the fine delay circuit and the code signal DN_C input into the coarse delay circuit, the deviation of the delay amount may be prevented by switching the code signal DN_F and then switching the code signal DN_C. Further, even when the switching timing is deviated, the error of the delay amount may be reduced.

As described above, the present embodiment may provide a memory system, a semiconductor storage device, and a duty adjustment circuit that improves the reliability of operation.

The DCC circuit 20 may be provided not only on the interface chip 2A but also on the non-volatile memory 2B. Further, the signals to be corrected are not limited to the duty cycles of the read enable signals RE and /RE and the data strobe signals DQS and /DQS. It may be provided at a portion where correction is performed for a signal that requires high-precision adjustment of the duty cycle with a high-speed clock.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A duty adjustment circuit comprising:
   a first delay circuit including a plurality of first delay elements connected in series, wherein each of the first delay elements has a first delay amount;
   a second delay circuit having a first variable delay unit configured to set a second delay amount smaller than the first delay amount; and
   a third delay circuit having a second variable delay unit configured to set a third delay amount smaller than the first delay amount,
   wherein an output terminal of the second delay circuit is connected to an even numbered one of the first delay elements, and an output terminal of the third delay circuit is connected to an odd numbered one of the first delay elements.

2. The duty adjustment circuit according to claim 1, further comprising:
   a first delay code setting circuit configured to generate a first instruction code for each of the plurality of first delay elements based on a coarse delay amount based on an integral multiple of the first delay amount; and
   a second delay code setting circuit configured to generate a second instruction code for the first variable delay unit based on a fine delay amount smaller than the first delay amount, and generate a third instruction code for the second variable delay unit based on the fine delay amount,
   wherein a sum of the second delay amount and the third delay amount is equal to the first delay amount.

3. The duty adjustment circuit according to claim 2, wherein the first instruction code is a thermometer code.

4. The duty adjustment circuit according to claim 2, further comprising:
   a delay amount determination circuit configured to determine a delay amount for delaying a rise or fall of an input clock signal to adjust a duty ratio of the input clock signal to about 50%,
   wherein a sum of the coarse delay amount and the fine delay amount is equal to the delay amount.

5. A semiconductor storage device comprising:
   an interface chip provided with a duty adjustment circuit that includes:
      a first delay circuit including a plurality of first delay elements connected in series, wherein each of the first delay elements has a first delay amount;
      a second delay circuit having a first variable delay unit configured to set a second delay amount smaller than the first delay amount; and
      a third delay circuit having a second variable delay unit configured to set a third delay amount smaller than the first delay amount,
      wherein an output terminal of the second delay circuit is connected to an even numbered one of the first delay elements, and an output terminal of the third delay circuit is connected to an odd numbered one of the first delay elements; and
   a non-volatile memory chip including a plurality of memory cells formed as a memory cell array,
   wherein the duty adjustment circuit adjusts a duty ratio of a read enable signal or a data strobe signal communicated between a controller and the non-volatile memory chip.

6. The semiconductor storage device according to claim 5, wherein the duty adjustment circuit adjusts the duty ratio to about 50%.

7. A memory system comprising:
   the semiconductor storage device according to claim 5; and
   the controller according to claim 5.

8. A method comprising:
   receiving a code signal indicating a pulse width of an input clock signal and a pulse width of an inversion logic of the input clock signal;
   counting a first number of high-level bits of the signal during a first cycle of the code signal;
   counting a second number of high-level bits of the signal during a second cycle of the code signal;
   determining a difference between the first number and second number; and
   determining, based on the determination, whether to update the code signal.

9. The method according to claim 8, wherein the code signal is configured for correcting a rising timing of the input clock signal, a rising timing of the inversion logic of the input clock signal.

10. The method according to claim 8, further comprising:
    in response to determining that the difference is equal to zero, determining not to update the code signal.

11. The method according to claim 8, further comprising:
    in response to determining that the difference is not equal to zero, determining to update the code signal.

12. The method according to claim 11, further comprising:
    in response to determining that the difference is greater than zero, determining to update one or more signals of the code signal that are configured to adjust a rising timing of the input clock signal.

13. The method according to claim 11, further comprising:
    in response to determining that the difference is less than zero, determining to update one or more signals of the code signal that are configured to adjust a rising timing of the inversion logic of the input clock signal.

* * * * *